United States Patent
Nakagawa et al.

(10) Patent No.: US 11,463,067 B2
(45) Date of Patent: Oct. 4, 2022

(54) MULTIPLEXER, RADIO-FREQUENCY FRONT END CIRCUIT, AND COMMUNICATION DEVICE

(71) Applicant: Murata Manufacturing Co., Ltd., Nagaokakyo (JP)

(72) Inventors: Ryo Nakagawa, Nagaokakyo (JP); Hideki Iwamoto, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 601 days.

(21) Appl. No.: 16/561,198

(22) Filed: Sep. 5, 2019

(65) Prior Publication Data

US 2019/0393855 A1  Dec. 26, 2019

Related U.S. Application Data

(63) Continuation of application No. PCT/JP2018/008914, filed on Mar. 8, 2018.

(30) Foreign Application Priority Data

Mar. 9, 2017 (JP) .............................. JP2017-044688

(51) Int. Cl.
 *H03H 9/02* (2006.01)
 *H03H 9/25* (2006.01)

(52) U.S. Cl.
 CPC .... *H03H 9/02559* (2013.01); *H03H 9/02834* (2013.01); *H03H 9/25* (2013.01)

(58) Field of Classification Search
 CPC .......... H03H 9/02559; H03H 9/02574; H03H 9/02834; H03H 9/25; H03H 9/6483; H03H 9/725; H04B 1/52
 (Continued)

(56) References Cited

U.S. PATENT DOCUMENTS 11,271,544 B2 *  3/2022  Nakagawa ............. H03H 9/725
2010/0182101 A1  7/2010  Suzuki
(Continued)

FOREIGN PATENT DOCUMENTS

JP  2010-187373 A   8/2010
JP  2014-068123 A   4/2014
(Continued)

OTHER PUBLICATIONS

Official Communication issued in International Patent Application No. PCT/JP2018/008914, dated May 22, 2018.

*Primary Examiner* — Tan H Trinh
(74) *Attorney, Agent, or Firm* — Keating & Bennett, LLP

(57) ABSTRACT

In a multiplexer, at least one acoustic wave filter includes a piezoelectric body made of lithium tantalate having Euler angles ($\varphi_{LT}=0°\pm5°$, $\theta_{LT}$, $\psi_{LT}=0°\pm15°$), a support substrate, and an interdigital transducer (IDT) electrode. A frequency $f_{h1\_t}^{(n)}$ of a first higher-order mode satisfies below Formulas (3) and (4) in all acoustic wave filters (m) having a higher pass band than at least one acoustic wave filter (n) ($n<m\leq N$) in at least one acoustic wave resonator among a plurality of acoustic wave resonators. $f_{h1\_t}^{(n)}>f_u^{(m)}$ Formula (3). $f_{h1\_t}^{(n)}<f_l^{(m)}$ Formula (4). Here, $f_u^{(m)}$ and $f_l^{(m)}$ represent the frequencies of the high-frequency end and the low-frequency end of the pass band in the m acoustic wave filters in Formulas (3) and (4).

20 Claims, 18 Drawing Sheets

(58) Field of Classification Search
USPC .................................................. 310/313 C
See application file for complete search history.

(56) References Cited

U.S. PATENT DOCUMENTS

| | | |
|---|---|---|
| 2013/0285768 A1 | 10/2013 | Watanabe et al. |
| 2014/0232239 A1* | 8/2014 | Iwasaki .................. H03H 9/131 310/313 C |
| 2016/0261249 A1 | 9/2016 | Takamine |
| 2017/0294897 A1 | 10/2017 | Kanazawa et al. |
| 2018/0019509 A1* | 1/2018 | Yasuda .................. H03H 9/725 |
| 2018/0138890 A1* | 5/2018 | Kubat ................. H03H 9/02228 |
| 2019/0214959 A1* | 7/2019 | Nosaka ................ H04B 1/0458 |
| 2019/0214968 A1* | 7/2019 | Matsutani ................ H03H 9/70 |
| 2020/0007109 A1* | 1/2020 | Nakagawa ............. H03H 9/145 |
| 2020/0177157 A1* | 6/2020 | Nakagawa ........... H03H 9/6406 |
| 2021/0184654 A1* | 6/2021 | Nakagawa ......... H03H 9/02543 |

FOREIGN PATENT DOCUMENTS

| | | | |
|---|---|---|---|
| WO | 2012/086639 A1 | 6/2012 | |
| WO | 2015/080045 A1 | 6/2015 | |
| WO | 2016/111262 A1 | 7/2016 | |

\* cited by examiner

MULTIPLEXER, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2017-044688 filed on Mar. 9, 2017 and is a Continuation Application of PCT Application No. PCT/JP2018/008914 filed on Mar. 8, 2018. The entire contents of each application are hereby incorporated herein by reference.

BACKGROUND OF THE INVENTION

1. Field of the Invention

The present invention relates to a multiplexer including two or more acoustic wave filters, a radio-frequency front end circuit including the multiplexer, and a communication device.

2. Description of the Related Art

Heretofore, multiplexers have been widely used in radio-frequency front end circuits of mobile phones and smartphones. For example, a multiplexer serving as a splitter disclosed in Japanese Unexamined Patent Application Publication No. 2014-68123 includes two or more band pass filters having different frequencies. Each band pass filter is formed of a surface acoustic wave filter chip. Each surface acoustic wave filter chip includes a plurality of surface acoustic wave resonators.

Japanese Unexamined Patent Application Publication No. 2010-187373 discloses an acoustic wave device in which an insulating film composed of silicon dioxide and a piezoelectric substrate composed of lithium tantalate are stacked on a silicon support substrate. In addition, the acoustic wave device has improved heat resistance due to the support substrate being bonded to the piezoelectric substrate at the (111) plane of silicon.

In the multiplexer disclosed in Japanese Unexamined Patent Application Publication No. 2014-68123, a plurality of acoustic wave filters having different frequencies are connected so as to form a common connection on the antenna terminal side.

The inventors of preferred embodiments of the present application discovered that, in the case of a structure in which a piezoelectric substrate made of lithium tantalate is directly or indirectly stacked on a support substrate made of silicon, a plurality of higher-order modes appear on the high-frequency side of the utilized main mode. In the case where such an acoustic wave resonator is used in an acoustic wave filter of a multiplexer having a lower frequency, there is a risk that a ripple generated by a higher-order mode of that acoustic wave filter will appear in the pass band of another acoustic wave filter of the multiplexer having a higher frequency than that acoustic wave filter. In other words, if a higher-order mode of the acoustic wave filter of the multiplexer having the lower frequency is located inside the pass band of the acoustic wave filter of the multiplexer having the higher frequency, a ripple will be generated in the pass band of the acoustic wave filter having the higher frequency. Therefore, there is a risk of the filter characteristics of the other acoustic wave filter being degraded.

SUMMARY OF THE INVENTION

Preferred embodiments of the present invention provide multiplexers in which a ripple due to a higher-order mode is unlikely to be generated in another band pass filter, radio-frequency front end circuits including the multiplexers, and communication devices.

As described later, the inventors of preferred embodiments of the present application discovered that in an acoustic wave resonator in which a piezoelectric body made of lithium tantalate is directly or indirectly stacked on a support substrate made of silicon, first to third higher-order modes, which are described later, appear on the high-frequency side of a main mode.

Multiplexers according to preferred embodiments of the present invention avoid a situation in which at least one higher-order mode among first, second, and third higher-order modes of one filter is generated in the pass band of another filter.

A multiplexer according to a preferred embodiment of the present invention includes N acoustic wave filters (N is an integer greater than or equal to 2) including first ends connected to define a common connection and having different pass bands from each other. At least one acoustic wave filter among the N acoustic wave filters except for the acoustic wave filter having the highest pass band includes a piezoelectric body made of lithium tantalate having Euler angles ($\varphi_{LT}=0°\pm5°$, $\theta_{LT}$, $\psi_{LT}=0°\pm15°$), a support substrate made of silicon having Euler angles ($\varphi_{Si}$, $\theta_{Si}$, $\psi_{Si}$), a silicon oxide film stacked between the piezoelectric body and the support substrate, and a plurality of acoustic wave resonators including interdigital transducer (IDT) electrodes provided on one surface of the piezoelectric body. When a thickness normalized using a wavelength $\lambda$ determined by an electrode finger pitch of the IDT electrode is referred to as a wavelength-normalized thickness, at least one out of first, second, and third higher-order mode frequencies $f_{hs\_t}^{(n)}$ (s is 1, 2, or 3, and the at least one higher-order mode is the first, second, or third higher-order mode when s is 1, 2, or 3) determined by Formula (1) and Formula (2) below using a wavelength-normalized thickness $T_{LT}$ of the piezoelectric body, Euler angles $\theta_{LT}$ of the piezoelectric body, a wavelength-normalized thickness $T_S$ of the silicon oxide film, a wavelength-normalized thickness $T_E$ of the IDT electrode converted into a thickness of aluminum, a propagation direction $\psi_{Si}$ inside the support substrate, and a wavelength-normalized thickness $T_{Si}$ of the support substrate has a value that satisfies Formula (3) or Formula (4) below in at least one acoustic wave resonator among the plurality of acoustic wave resonators for all values of m where m>n.

$$V_h = a_{T_{LT}}^{(3)}((T_{LT}+c_{T_{LT}})+b_{T_{LT}}^{(3)})^3 +$$
$$a_{T_{LT}}^{(2)}((T_{LT}+c_{T_{LT}})+b_{T_{LT}}^{(2)})^2 + a_{T_{LT}}^{(1)}(T_{LT}+c_{T_{LT}}) +$$
$$a_{T_S}^{(2)}((T_S+c_{T_S})+b_{T_S}^{(2)})^2 + a_{T_S}^{(1)}(T_S+c_{T_S}) + a_{I_E}^{(1)}(T_E+c_{T_E}) +$$
$$a_{\psi_{Si}}^{(5)}((\psi_{Si}+c_{\psi_{Si}})^5+b_{\psi_{Si}}^{(5)}) + a_{\psi_{Si}}^{(4)}((\psi_{Si}+c_{\psi_{Si}})^4+b_{\psi_{Si}}^{(4)}) +$$
$$a_{\psi_{Si}}^{(3)}((\psi_{Si}+c_{\psi_{Si}})^3+b_{\psi_{Si}}^{(3)}) + a_{\psi_{Si}}^{(2)}((\psi_{Si}+c_{\psi_{Si}})^2+b_{\psi_{Si}}^{(2)}) +$$
$$a_{\psi_{Si}}^{(1)}((\psi_{Si}+c_{\psi_{Si}}) + d_{T_{LT}T_S}(T_{LT}+c_{T_{LT}})(T_S+c_{T_S}) +$$
$$d_{T_{LT}T_E}(T_{LT}+c_{T_{LT}})(T_E+c_{T_E}) + d_{T_{LT}\psi_{Si}}(T_{LT}+c_{T_{LT}})$$
$$(\psi_{Si}+c_{\psi_{Si}}) + d_{T_S\psi_{Si}}(T_S+c_{T_{LT}})(\psi_{Si}+c_{\psi_{Si}}) + e \quad \text{Formula (1)}$$

$$f_{hs\_t}^{(n)} = \frac{V_{hs\_t}}{\lambda_t^{(n)}}, (s=1,2,3) \quad \text{Formula (2)}$$

$$f_{hs\_t}^{(n)} > f_u^{(m)}; \quad \text{Formula (3)}$$

$$f_{hs\_t}^{(n)} > f_1^{(m)}; \quad \text{Formula (4)}$$

The h in Formulas (1) to (4) indicates a higher-order mode, t indicates the t-th element (resonator) in a filter n, m indicates the m-th (m>n) filter, n indicates the n-th filter, $f_u^{(m)}$ is the frequency of the high-frequency end of the pass band of the m-th filter, and $f_l^{(m)}$ is the frequency of the low-frequency end of the pass band of the m-th filter.

The coefficients in Formula (1) respectively have values illustrated in Table 1, Table 2, or Table 3 below for the various crystal orientations of the support substrate when s=1, 2, or 3.

TABLE 1 s = 1, FIRST HIGHER-ORDER MODE

| | Si (100) | Si (110) | Si (111) |
|---|---|---|---|
| $a_{TLT}^{(3)}$ | 0 | 0 | 0 |
| $a_{TLT}^{(2)}$ | 0 | 0 | 0 |
| $a_{TLT}^{(1)}$ | 425.9853852 | 0 | 0 |
| $b_{TLT}^{(3)}$ | 0 | 0 | 0 |
| $b_{TLT}^{(2)}$ | 0 | 0 | 0 |
| $c_{TLT}$ | −0.250788644 | 0 | 0 |
| $a_{TS}^{(2)}$ | 0 | 0 | 0 |
| $a_{TS}^{(1)}$ | −310.7909155 | −336.9145368 | −208.7868214 |
| $b_{TS}^{(2)}$ | 0 | 0 | 0 |
| $c_{TS}$ | −0.251419558 | −0.250089767 | −0.249747475 |
| $a_{TE}^{(1)}$ | −343.0400174 | 0 | 0 |
| $c_{TE}$ | −0.24873817 | 0 | 0 |
| $a_{\psi Si}^{(5)}$ | 0 | −6.74946E−06 | 0 |
| $a_{\psi Si}^{(4)}$ | 0 | −5.20462E−05 | 0.000690127 |
| $a_{\psi Si}^{(3)}$ | 0.038289166 | 0.019803303 | −0.00044565 |
| $a_{\psi Si}^{(2)}$ | −0.094964284 | 0.235712151 | −0.943979094 |
| $a_{\psi Si}^{(1)}$ | −38.67353446 | −1.11114231 | 0.284195786 |
| $b_{\psi Si}^{(5)}$ | 0 | −235465.9067 | 0 |
| $b_{\psi Si}^{(4)}$ | 0 | −1403030.838 | −343485.2344 |
| $b_{\psi Si}^{(3)}$ | −61.4670366 | −53.06358055 | −25.37154865 |
| $b_{\psi Si}^{(2)}$ | −281.9457851 | −893.934227 | −449.418905 |
| $c_{\psi Si}$ | −22.38170347 | −44.91921005 | −29.88636364 |
| $d_{TLTTS}$ | 3598.117475 | 0 | 0 |
| $d_{TLTTE}$ | 0 | 0 | 0 |
| $d_{TLT\psi Si}$ | 0 | 0 | 0 |
| $d_{TS\psi Si}$ | 0 | 0 | 0 |
| e | 5106.391818 | 5059.084381 | 4779.583333 |

TABLE 2 s = 2, SECOND HIGHER-ORDER MODE

| | Si (100) | Si (110) | Si (111) |
|---|---|---|---|
| $a_{TLT}^{(3)}$ | 0 | 0 | 0 |
| $a_{TLT}^{(2)}$ | −2702.266236 | 0 | −5653.691353 |
| $a_{TLT}^{(1)}$ | −1108.194719 | −1832.484916 | −2085.431191 |
| $b_{TLT}^{(3)}$ | 0 | 0 | 0 |
| $b_{TLT}^{(2)}$ | −0.012562893 | 0 | −0.012525532 |
| $c_{TLT}$ | −0.25 | −0.266459627 | −0.249076517 |
| $a_{TS}^{(2)}$ | 0 | 0 | −5326.265048 |
| $a_{TS}^{(1)}$ | −1098.807554 | −1414.469094 | −1393.920797 |
| $b_{TS}^{(2)}$ | 0 | 0 | −0.012524975 |
| $c_{TS}$ | −0.250314465 | −0.265838509 | −0.248812665 |
| $a_{TE}^{(1)}$ | −425.2493774 | −685.2532789 | −603.1460469 |
| $c_{TE}$ | −0.249056604 | −0.252070393 | −0.24762533 |
| $a_{\psi Si}^{(5)}$ | 0 | 0 | 0 |
| $a_{\psi Si}^{(4)}$ | 0 | −7.98132E−05 | 0 |
| $a_{\psi Si}^{(3)}$ | −0.012639133 | 0.000280497 | 0 |
| $a_{\psi Si}^{(2)}$ | 0.036371829 | 0.263718689 | 0 |
| $a_{\psi Si}^{(1)}$ | 9.405264592 | −1.800655724 | 0 |
| $b_{\psi Si}^{(5)}$ | 0 | 0 | 0 |
| $b_{\psi Si}^{(4)}$ | 0 | −1489444.776 | 0 |
| $b_{\psi Si}^{(3)}$ | 42.45115095 | 393.1833251 | 0 |
| $b_{\psi Si}^{(2)}$ | −281.2411 | −940.0003858 | 0 |
| $c_{\psi Si}$ | −22.59433962 | −45.2484472 | 0 |
| $d_{TLTTS}$ | 1797.090996 | 3053.077023 | 0 |
| $d_{TLTTE}$ | −1817.694482 | −2508.85267 | −2601.663877 |
| $d_{TLT\psi Si}$ | 17.0066332 | 9.642397707 | 0 |
| $d_{TS\psi Si}$ | 0 | 0 | 0 |
| e | 5155.137964 | 5034.276458 | 5161.838907 |

TABLE 3 s = 3, THIRD HIGHER-ORDER MODE

| | Si (100) | Si (110) | Si (111) |
|---|---|---|---|
| $a_{TLT}^{(3)}$ | 0 | 0 | −58248.54264 |
| $a_{TLT}^{(2)}$ | 0 | 0 | −10052.90506 |
| $a_{TLT}^{(1)}$ | −881.5328828 | −891.2132267 | −825.4348061 |
| $b_{TLT}^{(3)}$ | 0 | 0 | 0.000343385 |
| $b_{TLT}^{(2)}$ | 0 | 0 | −0.009223119 |
| $c_{TLT}$ | −0.277777778 | −0.276070529 | −0.290410959 |
| $a_{TS}^{(2)}$ | 0 | 0 | −3303.852968 |
| $a_{TS}^{(1)}$ | −722.2669843 | −259.1483206 | −421.8924339 |
| $b_{TS}^{(2)}$ | 0 | 0 | −0.012156596 |
| $c_{TS}$ | −0.274603175 | −0.266498741 | −0.271917808 |
| $a_{TE}^{(1)}$ | −261.1025861 | −448.4580385 | −531.0198608 |
| $c_{TE}$ | −0.261904762 | −0.262342569 | −0.256506849 |
| $a_{\psi Si}^{(5)}$ | 0 | −3.61058E−06 | 0 |
| $a_{\psi Si}^{(4)}$ | 0 | −0.000249103 | −0.0003974 |
| $a_{\psi Si}^{(3)}$ | 0 | 0.006443619 | −0.00154155 |
| $a_{\psi Si}^{(2)}$ | 0 | 0.644131383 | 0.487445508 |
| $a_{\psi Si}^{(1)}$ | 1.602749894 | 0.627373798 | −0.86354673 |
| $b_{\psi Si}^{(5)}$ | 0 | 18501818.64 | 0 |
| $b_{\psi Si}^{(4)}$ | 0 | −1623407.504 | −318077.4424 |
| $b_{\psi Si}^{(3)}$ | 0 | 6212.965329 | 436.5271955 |
| $b_{\psi Si}^{(2)}$ | 0 | −979.8076252 | −423.4213736 |
| $c_{\psi Si}$ | −22.08333333 | −47.15365239 | −30.61643836 |
| $d_{TLTTS}$ | −2440.090544 | 0 | 0 |
| $d_{TLTTE}$ | 0 | 0 | −3130.610284 |
| $d_{TLT\psi Si}$ | 0 | 17.13013839 | 0 |
| $d_{TS\psi Si}$ | −11.7280604 | 0 | 0 |
| e | 5649.089206 | 5407.876804 | 5432.527804 |

A multiplexer according to a preferred embodiment of the present invention includes N acoustic wave filters (N is an integer greater than or equal to 2) having first ends connected to define a common connection and having different pass bands from each other. When the N acoustic wave filters are regarded as being an acoustic wave filter (1), an acoustic wave filter (2), . . . an acoustic wave filter (N) in order of increasing pass band, at least one acoustic wave filter (n) (1≤n<N) except for the acoustic wave filter having the highest pass band among the N acoustic wave filters includes at least one acoustic wave resonator. The acoustic wave resonator includes a piezoelectric body made of lithium tantalate having Euler angles ($\varphi_{LT}$=0°±5°, $\theta_{LT}$, $\psi_{LT}$=0°±15°), a support substrate made of silicon having Euler angles ($\varphi_{Si}$, $\theta_{Si}$, $\psi_{Si}$), and an IDT electrode provided on one surface of the piezoelectric body. In the acoustic wave resonator, when a thickness normalized using a wavelength λ determined by an electrode finger pitch of the IDT electrode is referred to as a wavelength-normalized thickness, $T_{LT}$ is a wavelength-normalized thickness of the piezoelectric body, $\theta_{LT}$ is Euler angles of the piezoelectric body, $T_S$ is a wavelength-normalized thickness of the silicon oxide film, $T_E$ is a wavelength-normalized thickness of the IDT electrode converted into a thickness of aluminum, $\psi_{Si}$ is a propagation direction inside the support substrate, and $T_{Si}$ is a wavelength-normalized thickness of the support substrate, at least one out of first, second, and third higher-order mode frequencies $f_{hs\_t}^{(n)}$ (s is 1, 2, or 3, and the at least one higher-order mode is the first, second, or third higher-order mode when s is 1, 2, or 3) determined by Formula (5) and Formula (2) below determined using $T_{LT}$, $\theta_{LT}$, $T_S$, $T_E$, $\psi_{Si}$, and $T_{Si}$ has a value that satisfies below Formula (3) or Formula (4) in all acoustic wave filters (m) (n<m≤N) having a higher pass band than the at least one acoustic wave filter (n).

$$V_h = a_{T_{LT}}^{(3)}\left((T_{LT} - c_{T_{LT}}) - b_{T_{LT}}^{(3)}\right)^3 + \quad \text{Formula (5)}$$

$$a_{T_{LT}}^{(2)}\left((T_{LT} - c_{T_{LT}}) - b_{T_{LT}}^{(2)}\right)^2 + a_{T_{LT}}^{(1)}(T_{LT} - c_{T_{LT}}) +$$

$$a_{T_S}^{(2)}\left((T_S - c_{T_S}) - b_{T_S}^{(2)}\right)^2 + a_{T_S}^{(1)}(T_S - c_{T_S}) + a_{T_E}^{(1)}(T_E - c_{T_E}) +$$

$$a_{\psi_{Si}}^{(5)}\left((\psi_{Si} - c_{\psi_{Si}})^5 - b_{\psi_{Si}}^{(5)}\right) + a_{\psi_{Si}}^{(4)}\left((\psi_{Si} - c_{\psi_{Si}})^4 - b_{\psi_{Si}}^{(4)}\right) +$$

$$a_{\psi_{Si}}^{(3)}\left((\psi_{Si} - c_{\psi_{Si}})^3 - b_{\psi_{Si}}^{(3)}\right) + a_{\psi_{Si}}^{(2)}\left((\psi_{Si} - c_{\psi_{Si}})^2 - b_{\psi_{Si}}^{(2)}\right) +$$

$$a_{\psi_{Si}}^{(1)}(\psi_{Si} - c_{\psi_{Si}}) + a_{\theta_{LT}}^{(2)}\left((\theta_{LT} - c_{\theta_{LT}})^2 - b_{\theta_{LT}}^{(2)}\right) +$$

$$a_{\theta_{LT}}^{(1)}(\theta_{LT} - c_{\theta_{LT}}) + d_{T_{LT}T_S}(T_{LT} - c_{T_{LT}})(T_S - c_{T_S}) +$$

$$d_{T_{LT}T_E}(T_{LT} - c_{T_{LT}})(T_E - c_{T_E}) +$$

$$d_{T_{LT}\psi_{Si}}(T_{LT} - c_{T_{LT}})(\psi_{Si} - c_{\psi_{Si}}) + e;$$

$$f_{h_s\_t}^{(n)} = \frac{V_{h_s\_t}}{\lambda_t^{(n)}}, (s = 1, 2, 3); \quad \text{Formula (2)}$$

$$f_{h_s\_t}^{(n)} > f_u^{(m)}; \quad \text{Formula (3)}$$

$$f_{h_s\_t}^{(n)} > f_l^{(m)}; \quad \text{Formula (4)}$$

The h in Formulas (2) to (4) and Formula (5) indicates a higher-order mode, $f_u^{(m)}$ is the frequency of the high-frequency end of the pass band of the acoustic wave filter (m), and $f_l^{(m)}$ is the frequency of the low-frequency end of the pass band of the acoustic wave filter (m).

The coefficients in Formula (5) respectively have values illustrated in below Table 4, Table 5, or Table 6 for the various crystal orientations of the support substrate when s=1, 2, or 3.

TABLE 4

| | s = 1, FIRST HIGHER-ORDER MODE | | |
|---|---|---|---|
| | Si(100) | Si(110) | Si(111) |
| $a_{TLT}^{(3)}$ | 0 | 0 | 0 |
| $a_{TLT}^{(2)}$ | 0 | 0 | 0 |
| $a_{TLT}^{(1)}$ | −436.3811104 | 0 | 0 |
| $b_{TLT}^{(3)}$ | 0 | 0 | 0 |
| $b_{TLT}^{(2)}$ | 0 | 0 | 0 |
| $c_{TLT}$ | 0.251271186 | 0 | 0 |
| $a_{TS}^{(2)}$ | 0 | 0 | 0 |
| $a_{TS}^{(1)}$ | −370.8189665 | 0 | −174.7116877 |
| $b_{TS}^{(2)}$ | 0 | 0 | 0 |
| $c_{TS}$ | 0.250529661 | 0 | 0.24371308 |
| $a_{TE}^{(1)}$ | 0 | 0 | 0 |
| $c_{TE}$ | 0 | 0 | 0 |
| $a_{\psi Si}^{(5)}$ | 0 | −6.73542E−06 | 0 |
| $a_{\psi Si}^{(4)}$ | 0 | −4.84328E−05 | 0.000703463 |
| $a_{\psi Si}^{(3)}$ | 0.044803063 | 0.020121569 | −4.77016E−05 |
| $a_{\psi Si}^{(2)}$ | −0.11149637 | 0.237494527 | −0.961938987 |
| $a_{\psi Si}^{(1)}$ | −43.37701861 | −1.22341255 | 0.091605753 |
| $b_{\psi Si}^{(5)}$ | 0 | −78830.27657 | 0 |
| $b_{\psi Si}^{(4)}$ | 0 | 1406271.562 | 340944.6167 |
| $b_{\psi Si}^{(3)}$ | 51.32996847 | −17.77613547 | −41.61537323 |
| $b_{\psi Si}^{(2)}$ | 280.2660593 | 895.2921635 | 446.7591732 |
| $c_{\psi Si}$ | 22.32521186 | 45.02689779 | 30.11392405 |
| $a_{\theta LT}^{(2)}$ | 0 | 0 | 0 |
| $a_{\theta LT}^{(1)}$ | 0 | 0 | 0 |
| $b_{\theta LT}^{(2)}$ | 0 | 0 | 0 |
| $c_{\theta LT}$ | −90 | −90 | −90 |
| $d_{TLTTS}$ | 0 | 0 | 0 |
| $d_{TLTTE}$ | 0 | 0 | 0 |
| $d_{TLT\psi Si}$ | 0 | 0 | 0 |
| e | 5141.869703 | 5073.066348 | 4781.489451 |

TABLE 5

| | s = 2, SECOND HIGHER-ORDER MODE | | |
|---|---|---|---|
| | Si(100) | Si(110) | Si(111) |
| $a_{TLT}^{(3)}$ | 0 | 0 | 0 |
| $a_{TLT}^{(2)}$ | −3168.980655 | −3017.48047 | −6490.588929 |
| $a_{TLT}^{(1)}$ | −1070.770975 | −1740.800945 | −1736.124534 |
| $b_{TLT}^{(3)}$ | 0 | 0 | 0 |
| $b_{TLT}^{(2)}$ | 0.012520877 | 0.011673567 | 0.012932291 |
| $c_{TLT}$ | 0.25 | 0.26454918 | 0.244042365 |
| $a_{TS}^{(2)}$ | 0 | 0 | −5447.157686 |
| $a_{TS}^{(1)}$ | −1175.713239 | −1443.794269 | −1260.230106 |
| $b_{TS}^{(2)}$ | 0 | 0 | 0.012411464 |
| $c_{TS}$ | 0.250104384 | 0.264754098 | 0.243336275 |
| $a_{TE}^{(1)}$ | −440.9839549 | −631.5739347 | −613.3480905 |
| $c_{TE}$ | 0.249686848 | 0.254030055 | 0.249646955 |
| $a_{\psi Si}^{(5)}$ | 0 | 0 | 0 |
| $a_{\psi Si}^{(4)}$ | 0 | −8.39122E−05 | 0 |
| $a_{\psi Si}^{(3)}$ | −0.01385161 | −0.000219614 | 0 |
| $a_{\psi Si}^{(2)}$ | 0.040113138 | 0.288564318 | 0.113517332 |
| $a_{\psi Si}^{(1)}$ | 10.06827612 | −1.021332326 | 0.01604077 |
| $b_{\psi Si}^{(5)}$ | 0 | 0 | 0 |
| $b_{\psi Si}^{(4)}$ | 0 | 1489555.068 | 0 |
| $b_{\psi Si}^{(3)}$ | −14.09179662 | −1671.679914 | 0 |
| $b_{\psi Si}^{(2)}$ | 281.2490194 | 936.1444126 | 446.7377612 |
| $c_{\psi Si}$ | 22.53131524 | 46.09631148 | 29.70873786 |
| $a_{\theta LT}^{(2)}$ | 0 | 0 | 0 |
| $a_{\theta LT}^{(1)}$ | −2.926997767 | 0 | 0 |
| $b_{\theta LT}^{(2)}$ | 0 | 0 | 0 |
| $c_{\theta LT}$ | −50.02087683 | −90 | −90 |
| $d_{TLTTS}$ | 0 | 0 | 0 |
| $d_{TLTTE}$ | −2151.133017 | −2785.629029 | −2639.620065 |
| $d_{TLT\psi Si}$ | 17.13925013 | 0 | 0 |
| e | 5188.573706 | 5052.799929 | 5187.888817 |

TABLE 6

| | s = 3, THIRD HIGHER-ORDER MODE | | |
|---|---|---|---|
| | Si(100) | Si(110) | Si(111) |
| $a_{TLT}^{(3)}$ | 24973.69604 | 0 | 0 |
| $a_{TLT}^{(2)}$ | 1430.312613 | 0 | −6156.310187 |
| $a_{TLT}^{(1)}$ | −1027.290569 | −737.4915071 | −1476.525631 |
| $b_{TLT}^{(3)}$ | −0.000364885 | 0 | 0 |
| $b_{TLT}^{(2)}$ | 0.011041041 | 0 | 0.009760415 |
| $c_{TLT}$ | 0.277376171 | 0.283128295 | 0.290986602 |
| $a_{TS}^{(2)}$ | 0 | 0 | 0 |
| $a_{TS}^{(1)}$ | −617.9601012 | 0 | 0 |
| $b_{TS}^{(2)}$ | 0 | 0 | 0 |
| $c_{TS}$ | 0.273226238 | 0 | 0 |
| $a_{TE}^{(1)}$ | −254.6645301 | −400.406917 | −524.8090015 |
| $c_{TE}$ | 0.262449799 | 0.265026362 | 0.25499391 |
| $a_{\psi Si}^{(5)}$ | 0 | 0 | 0 |
| $a_{\psi Si}^{(4)}$ | 0 | −0.000208283 | −0.000637441 |
| $a_{\psi Si}^{(3)}$ | 0 | −0.004709453 | −0.001817349 |
| $a_{\psi Si}^{(2)}$ | −0.126294383 | 0.574442977 | 0.749991624 |
| $a_{\psi Si}^{(1)}$ | 2.746835794 | 7.891650217 | −0.116425099 |
| $b_{\psi Si}^{(5)}$ | 0 | 0 | 0 |
| $b_{\psi Si}^{(4)}$ | 0 | 1654327.754 | 303345.3736 |
| $b_{\psi Si}^{(3)}$ | 0 | −7229.860818 | −201.8986483 |
| $b_{\psi Si}^{(2)}$ | 266.9400494 | 985.3381236 | 411.1815157 |
| $c_{\psi Si}$ | 22.10843373 | 47.8602812 | 30.42021924 |
| $a_{\theta LT}^{(2)}$ | 0 | 0 | 0.593925697 |
| $a_{\theta LT}^{(1)}$ | 0 | 0 | −2.75182308 |
| $b_{\theta LT}^{(2)}$ | 0 | 0 | 67.60597649 |
| $c_{\theta LT}$ | −90 | −90 | −49.6589525 |
| $d_{TLTTS}$ | −2391.060714 | 0 | 0 |
| $d_{TLTTE}$ | 0 | 0 | −2773.934251 |
| $d_{TLT\psi Si}$ | −12.5134053 | 15.88855602 | 0 |
| e | 5661.675305 | 5417.174527 | 5440.57579 |

Using Formula (5), in the multiplexer of the present preferred embodiment, $\theta_{LT}$, which is not considered in Formula (1), is also taken into consideration, and therefore the at least one higher-order mode among the plurality of higher-order modes of one acoustic wave filter is even less likely to be generated inside the pass band of another acoustic wave filter having a higher pass band.

In a multiplexer according to a preferred embodiment of the present invention, the values of $T_{LT}$, $\theta_{LT}$, $T_S$, $T_E$, $\psi_{Si}$, and $T_{Si}$ are selected so that the first and second higher-order mode frequencies $f_{hs\_t}^{(n)}$ satisfy Formula (3) or Formula (4).

In a multiplexer according to a preferred embodiment of the present invention, the values of $T_{LT}$, $\theta_{LT}$, $T_S$, $T_E$, $\psi_{Si}$, and $T_{Si}$ are selected so that the first and third higher-order mode frequencies $f_{hs\_t}^{(n)}$ satisfy Formula (3) or Formula (4).

In a multiplexer according to a preferred embodiment of the present invention, the values of $T_{LT}$, $\theta_{LT}$, $T_S$, $T_E$, $\psi_{Si}$, and $T_{Si}$ are selected so that the second and third higher-order mode frequencies $f_{hs\_t}^{(n)}$ satisfy Formula (3) or Formula (4).

In a multiplexer according to a preferred embodiment of the present invention, the values of $T_{LT}$, $\theta_{LT}$, $T_S$, $T_E$, $\psi_{Si}$, and $T_{Si}$ are selected so that the first, second, and third higher-order mode frequencies $f_{hs\_t}^{(n)}$ all satisfy Formula (3) or Formula (4). In this case, ripples caused by responses of the first higher-order mode, the second higher-order mode, and the third higher-order mode do not appear in the pass band of the other acoustic wave filter.

In a multiplexer according to a preferred embodiment of the present invention, $T_{Si} > 4$ for the wavelength-normalized thickness $T_{Si}$ of the support substrate.

In a multiplexer according to a preferred embodiment of the present invention, $T_{Si} > 10$.

In a multiplexer according to a preferred embodiment of the present invention, $T_{Si} > 20$.

In a multiplexer according to a preferred embodiment of the present invention, the wavelength-normalized thickness of the piezoelectric body is less than or equal to about $3.5\lambda$.

In a multiplexer according to a preferred embodiment of the present invention, the wavelength-normalized thickness of the piezoelectric body is less than or equal to about $2.5\lambda$.

In a multiplexer according to a preferred embodiment of the present invention, the wavelength-normalized thickness of the piezoelectric body is less than or equal to about $1.5\lambda$.

In a multiplexer according to a preferred embodiment of the present invention, the wavelength-normalized thickness of the piezoelectric body is less than or equal to about $0.5\lambda$.

In a multiplexer according to a preferred embodiment of the present invention, the multiplexer further includes an antenna terminal to which first ends of a plurality of acoustic wave filters are connected to define a common connection, the acoustic wave resonator that satisfies Formula (3) and Formula (4) being an acoustic wave resonator that is closest to the antenna terminal. In this case, ripples due to the first, second, and third higher-order modes are even less likely to be generated in the pass band of the other acoustic wave filter.

In a multiplexer according to a preferred embodiment of the present invention, the plurality of acoustic wave resonators are all acoustic wave resonators that satisfy Formula (3) and Formula (4). In this case, ripples due to at least one higher-order mode among the first, second, and third higher-order modes can be more effectively suppressed in other acoustic wave filter.

A multiplexer according to a preferred embodiment of the present invention may be a duplexer.

In addition, a multiplexer according to a preferred embodiment the present invention may be a composite filter in which three or more acoustic wave filters are connected to define a common connection on the antenna terminal side.

In a multiplexer according to a preferred embodiment of the present invention, the multiplexer is a composite filter device used in carrier aggregation.

In a multiplexer according to a preferred embodiment of the present invention, the acoustic wave filter including a plurality of acoustic wave resonators is preferably a ladder filter that includes a plurality of series arm resonators and a plurality of parallel arm resonators. In this case, the effect of higher-order modes can be more effectively reduced or prevented.

A radio-frequency front end circuit according to a preferred embodiment of the present invention includes a multiplexer according to a preferred embodiment of the present invention and a power amplifier.

A communication device according to a preferred embodiment of the present invention includes a radio-frequency front end circuit including a multiplexer according to a preferred embodiment of the present invention and a power amplifier, and an RF signal processing circuit.

According to a multiplexers of preferred embodiments of the present invention, at least one higher-order mode among a plurality of higher-order modes generated by at least one acoustic wave resonator of an acoustic wave filter having a lower pass band is unlikely to be generated inside the pass band of another acoustic wave filter having a higher pass band. Therefore, degradation of the filter characteristics of the other acoustic wave filter is unlikely to occur. Therefore, radio-frequency front end circuits and communication devices that each include a multiplexer having excellent filter characteristics are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be made clearer by describing specific preferred embodiments of the present invention with reference to the drawings.

The preferred embodiments described in the present specification are illustrative examples and portions of the configurations illustrated in different preferred embodiments can be substituted for one another or combined with one another.

Figure 1:
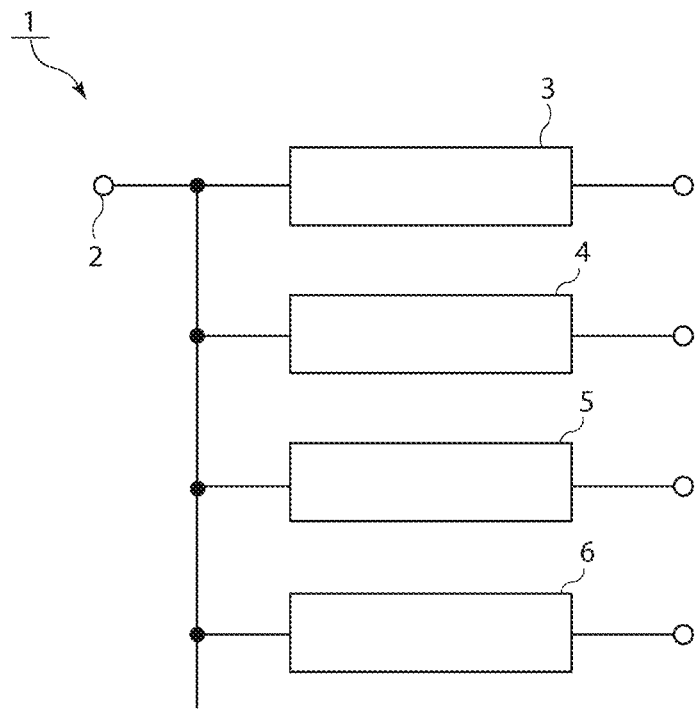
FIG. 1 is a circuit diagram of a multiplexer according to a first preferred embodiment of the present invention.

FIG. 1 is a circuit diagram of a multiplexer according to a first preferred embodiment of the present invention. A multiplexer 1 includes an antenna terminal 2. The antenna terminal 2 is preferably a terminal that is connected to the antenna of a smartphone, for example.

In the multiplexer 1, a first acoustic wave filter 3, a second acoustic wave filter 4, a third acoustic wave filter 5, and a fourth acoustic wave filter 6 are connected to the antenna terminal 2 via a common connection. The first to fourth acoustic wave filters 3 to 6 are preferably band pass filters.

Figure 4:
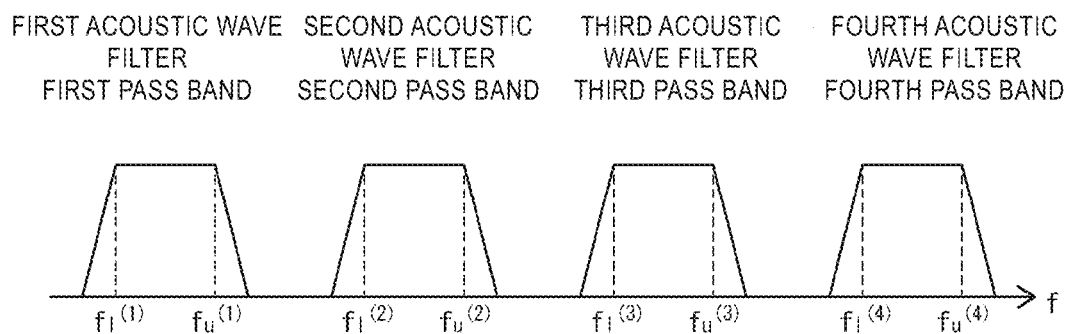
FIG. 4 is a schematic diagram illustrating the pass bands of first to fourth acoustic wave filters in the first preferred embodiment of the present invention.

FIG. 4 is a schematic diagram illustrating the relationship between the pass bands of the first to fourth acoustic wave filters 3 to 6. As illustrated in FIG. 4, the first to fourth acoustic wave filters preferably have different pass bands. The pass bands of the first to fourth acoustic wave filters are respectively referred to as first to fourth pass bands.

The frequency positions of the pass bands are preferably as follows: first pass band<second pass band<third pass band<fourth pass band. In the second to fourth pass bands, a low-frequency end is denoted as $f_l^{(m)}$ and a high-frequency end is denoted as $f_u^{(m)}$. The low-frequency end is the low-frequency end of the pass band. In addition, the high-frequency end is the high-frequency end of the pass band. For example, the ends of the frequency bands of the bands standardized in 3GPP or the like can be used as the low-frequency ends and high-frequency ends of the pass bands.

Here, (m) is 2, 3, or 4 in accordance with the second to fourth pass bands.

Figure 2:
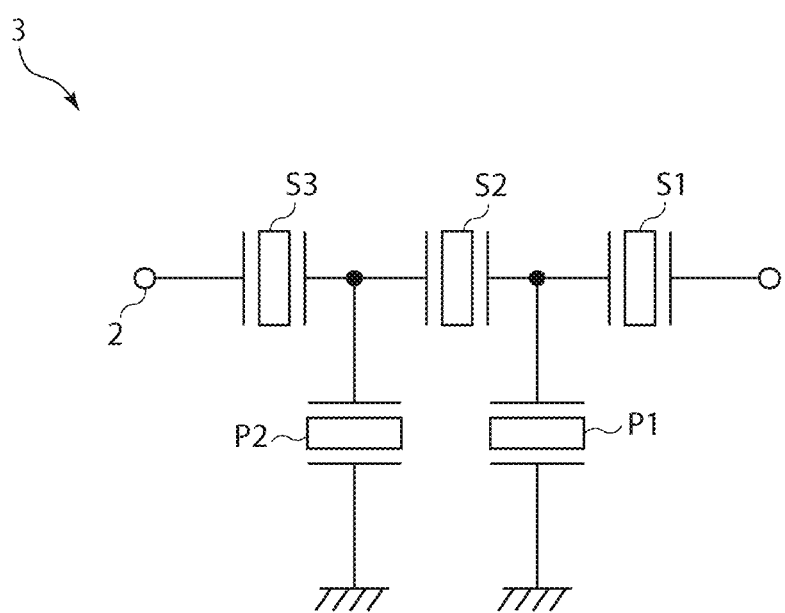
FIG. 2 is a circuit diagram illustrating a first acoustic wave filter used in the multiplexer of the first preferred embodiment of the present invention.

The first to fourth acoustic wave filters 3 to 6 each preferably include a plurality of acoustic wave resonators. FIG. 2 is a circuit diagram of the first acoustic wave filter 3. The first acoustic wave filter 3 includes series arm resonators S1 to S3 and parallel arm resonators P1 and P2, which are each preferably defined by an acoustic wave resonator. In other words, the first acoustic wave filter 3 is preferably a ladder filter. However, the number of series arm resonators and the number of parallel arm resonators in the ladder filter are not limited to the numbers illustrated in this example.

Furthermore, the second to fourth filters 4 to 6 are similarly each preferably a ladder filter and include a plurality of series arm resonators and a plurality of parallel arm resonators.

Provided that the first to fourth acoustic wave filters 3 to 6 include a plurality of acoustic wave resonators, the first to fourth acoustic wave filters 3 to 6 may have a configuration other than a ladder filter configuration. For example, the first to fourth acoustic wave filters 3 to 6 may each be an acoustic wave filter in which an acoustic wave resonator is serially electrically connected to a longitudinally coupled resonator acoustic wave filter. In addition, the first to fourth acoustic wave filters 3 to 6 may each be an acoustic wave filter in which a ladder filter is connected to a longitudinally coupled resonator acoustic wave filter.

Figure 3A:
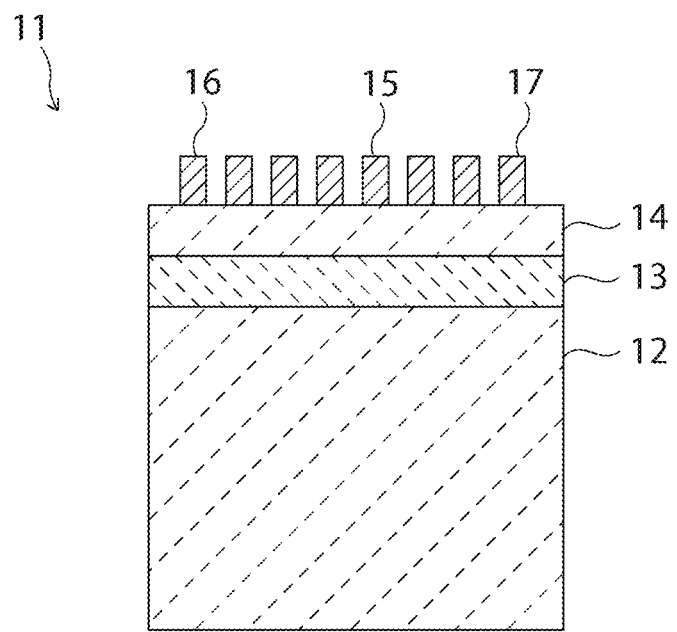
FIG. 3A is a schematic front cross-sectional view of the acoustic wave resonator used in the multiplexer of the first preferred embodiment of the present invention and FIG. 3B is a schematic plan view illustrating the electrode structure of the acoustic wave resonator.
Figure 3B:
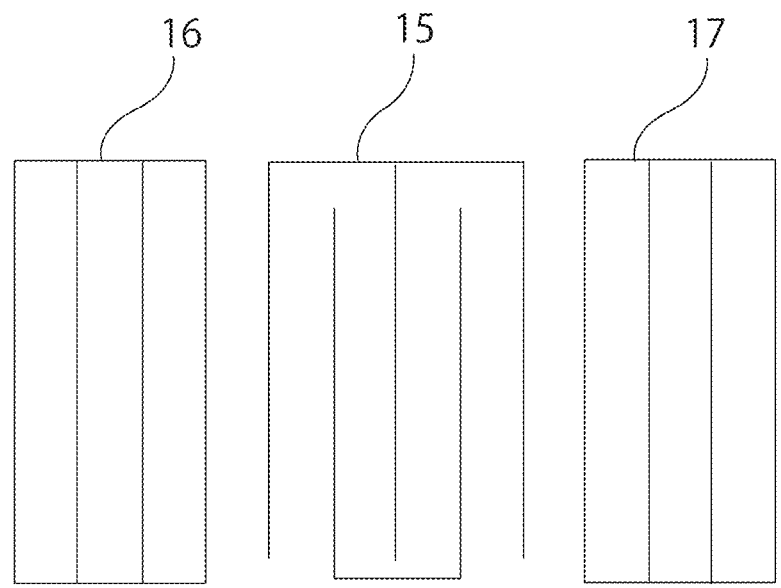

FIG. 3A is a schematic front cross-sectional view of an acoustic wave resonator used for the series arm resonators S1 to S3 or the parallel arm resonators P1 and P2 of the first acoustic wave filter 3 and FIG. 3B is a schematic plan view illustrating the electrode structure of the acoustic wave resonator.

An acoustic wave resonator 11 preferably includes a support substrate 12, a silicon oxide film 13 stacked on the support substrate 12, and a piezoelectric body 14 stacked on the silicon oxide film 13. It is sufficient that a silicon oxide film 13 may be stacked indirectly on (or above) the support substrate 12, and the piezoelectric body 14 may be stacked indirectly on (or above) the silicon oxide film 13.

The support substrate 12 is preferably made of silicon, for example. Specifically, the support substrate 12 is preferably made of single crystal silicon, but it is sufficient that the support substrate 12 have a crystal orientation and does not need to be a perfect single crystal. The silicon oxide film 13 is preferably a silicon oxide film. Specifically, the silicon oxide film 13 may preferably contain silicon oxide doped with fluorine or the like as long as the silicon oxide film 13 contains silicon oxide. The piezoelectric body 14 is preferably made of lithium tantalate, for example. Specifically, the piezoelectric body 14 is preferably single crystal lithium tantalate, but it is sufficient that the piezoelectric body 14 have a crystal orientation and does not have to be a perfect single crystal. In addition, the piezoelectric body 14 is preferably made of lithium tantalate but may instead be material other than $LiTaO_3$.

The thickness of the silicon oxide film 13 may be 0 μm if so desired. In other words, the silicon oxide film 13 does not necessarily have to be provided.

An interdigital transducer (IDT) electrode 15 is preferably provided on an upper surface of the piezoelectric body 14. More specifically, reflectors 16 and 17 are provided on both sides of the IDT electrode 15 in the acoustic wave propagation direction, and a one-port surface acoustic wave resonator is thus defined. The IDT electrode 15 may be provided indirectly on (or above) the piezoelectric body 14.

The inventors of preferred embodiments of the present invention discovered that, in addition to the response of the main mode that is to be utilized, a plurality of higher-order mode responses appear on the high-frequency side of the main mode when an acoustic wave is excited in the acoustic wave filter device in which the piezoelectric body 14 made of lithium tantalate is directly or indirectly stacked on the support substrate 12. The plurality of higher-order modes will be described with reference to FIG. 5.

Figure 5:
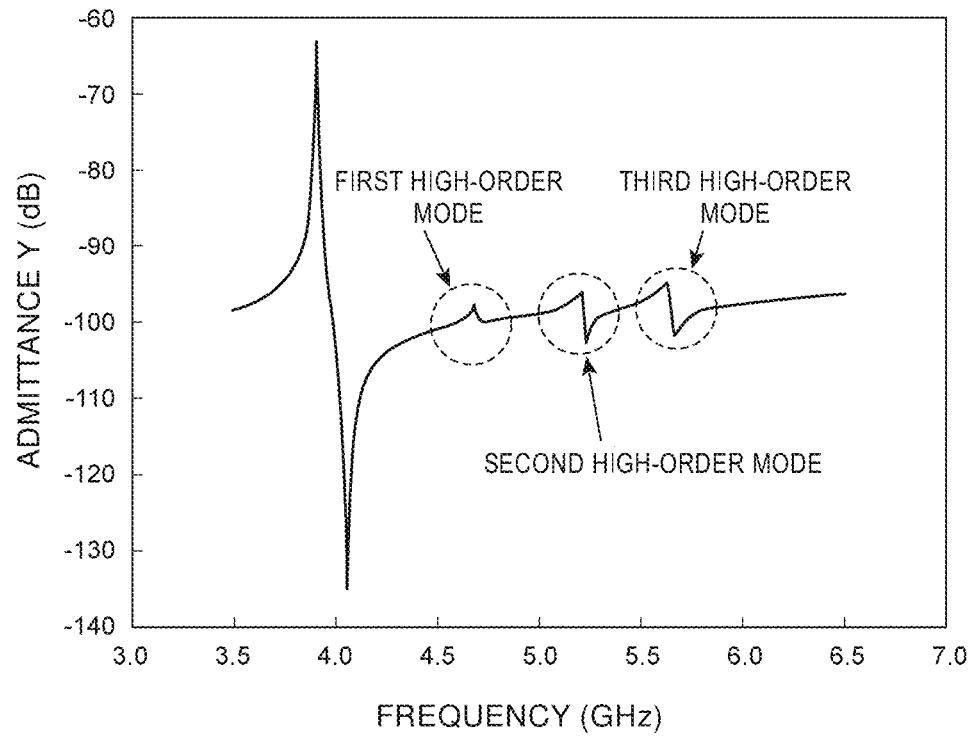
FIG. 5 is a diagram illustrating an admittance characteristic of the acoustic wave resonator.

FIG. 5 is a diagram illustrating the admittance characteristic in an example of an acoustic wave resonator in which a silicon oxide film and a piezoelectric body are stacked on a support substrate. As is clear from FIG. 5, first to third higher-order mode responses appear at higher frequency positions than a main mode response that appears around 3.9 GHz. The first higher-order mode response appears around 4.7 GHz as indicated by an arrow. The second higher-order mode response appears at a higher frequency around 5.2 GHz. The third higher-order mode response appears around 5.7 GHz. In other words, when f1 is the frequency of the first higher-order mode response, f2 is the frequency of the second higher-order mode response, and f3 is the frequency of the third higher-order mode, f1<f2<f3. The frequencies of the higher-order mode responses are at the positions of the peaks of the higher-order modes in the impedance phase characteristic. FIG. 5 is merely an example and the frequency position relationships of the higher-order modes may be interchanged with each other depending on conditions such as electrode thickness.

As described above, in a multiplexer in which a plurality of acoustic wave filters having different frequencies are connected on an antenna terminal side to define a common connection, when a higher-order mode generated by an acoustic wave filter of the multiplexer having a lower frequency appears in the pass band of another acoustic wave filter of the multiplexer having a higher frequency, a ripple is generated. Therefore, it is preferable that at least one higher-order mode out of the first higher-order mode, the second higher-order mode, and the third higher-order mode does not appear in the pass bands of the second to fourth acoustic wave filters 4 to 6. Preferably, two higher-order modes out of the first higher-order mode, the second higher-order mode, and the third higher-order mode do not appear in the pass bands of the second to fourth acoustic wave filters 4 to 6. For example, it is preferable that the first higher-order mode and second higher-order mode responses, the first higher-order mode and third higher-order mode responses, or the second higher-order mode and third higher-order mode responses do not appear in the pass bands of the second to fourth acoustic wave filters 4 to 6. Furthermore, preferably, none of the first higher-order mode, the second higher-order mode, and the third higher-order mode appear in the pass bands of the second to fourth acoustic wave filters 4 to 6.

A feature of the multiplexer 1 of the present preferred embodiment is that the first higher-order mode response of at least one acoustic wave resonator of the first acoustic wave filter 3 does not appear in the second to fourth pass bands illustrated in FIG. 4. Therefore, degradation of the filter characteristics of the second to fourth acoustic wave filters 4 to 6 is unlikely to occur. This feature of the present preferred embodiment is detailed in i) and ii) below.

i) Formula (1) and Formula (2) below are determined from the values of the wavelength-normalized thickness $T_{LT}$ of the piezoelectric body 14 made of lithium tantalate, Euler angles $\theta_{LT}$ of the piezoelectric body 14 made of lithium tantalate, the wavelength-normalized thickness $T_S$ of the silicon oxide film 13, the wavelength-normalized thickness $T_E$ of the IDT electrode 15 converted into an aluminum thickness, the propagation direction $\psi_{Si}$ in the support substrate 12, and a wavelength-normalized thickness $T_{Si}$ of the support substrate 12, and a frequency $f_{h1\_t}^{(n)}$, that is, a first higher-order mode frequency $f_{h1\_t}^{(n)}$ has a value that satisfies Formula (3) or Formula (4) below for all values of m where m>n; and ii) $T_{Si}$>20.

Consequently, the response due to the first higher-order mode is located outside the pass bands of the second to fourth acoustic wave filters 4 to 6. Therefore, degradation of the filter characteristics of the second to fourth acoustic wave filters 4 to 6 due to the first higher-order mode is unlikely to occur. Positioning of the first higher-order mode frequency outside of the second to fourth pass bands by satisfying the above conditions will be described in more detail below.

$$V_h = a_{T_{LT}}^{(3)}\left((T_{LT} + c_{T_{LT}}) + b_{T_{LT}}^{(3)}\right)^3 +$$
$$a_{T_{LT}}^{(2)}\left((T_{LT} + c_{T_{LT}}) + b_{T_{LT}}^{(2)}\right)^2 + a_{T_{LT}}^{(1)}(T_{LT} + c_{T_{LT}}) +$$
$$a_{T_S}^{(2)}\left((T_S + c_{T_S}) + b_{T_S}^{(2)}\right)^2 + a_{T_S}^{(1)}(T_S + c_{T_S}) + a_{I_E}^{(1)}(T_E + c_{T_E}) +$$
$$a_{\psi_{Si}}^{(5)}\left((\psi_{Si} + c_{\psi_{Si}})^5 + b_{\psi_{Si}}^{(5)}\right) + a_{\psi_{Si}}^{(4)}\left((\psi_{Si} + c_{\psi_{Si}})^4 + b_{\psi_{Si}}^{(4)}\right) +$$
$$a_{\psi_{Si}}^{(3)}\left((\psi_{Si} + c_{\psi_{Si}})^3 + b_{\psi_{Si}}^{(3)}\right) + a_{\psi_{Si}}^{(2)}\left((\psi_{Si} + c_{\psi_{Si}})^2 + b_{\psi_{Si}}^{(2)}\right) +$$
$$a_{\psi_{Si}}^{(1)}\left((\psi_{Si} + c_{\psi_{Si}})\right) + d_{T_{LT}T_S}(T_{LT} + c_{T_{LT}})(T_S + c_{T_S}) +$$
$$d_{T_{LT}T_E}(T_{LT} + c_{T_{LT}})(T_E + c_{T_E}) + d_{T_{LT}\psi_{Si}}(T_{LT} + c_{T_{LT}})$$
$$(\psi_{Si} + c_{\psi_{Si}}) + d_{T_S\psi_{Si}}(T_S + c_{T_{LT}})(\psi_{Si} + c_{\psi_{Si}}) + e$$

Formula (1)

$$f_{h_s\_t}^{(n)} = \frac{V_{h_s\_t}}{\lambda_t^{(n)}}, (s = 1, 2, 3)$$

Formula (2)

It is further preferable that an acoustic velocity $V_h$ expressed by Formula (5) below is used instead of the acoustic velocity $V_h$ expressed by Formula (1). In this case, a ripple due to a higher-order mode is even less likely to occur in the other band pass filters.

$$V_h = a_{T_{LT}}^{(3)}((T_{LT}-c_{T_{LT}})-b_{T_{LT}}^{(3)})^3 + a_{T_{LT}}^{(2)}((T_{LT}-c_{T_{LT}})-$$
$$b_{T_{LT}}^{(2)})^2 + a_{T_{LT}}^{(1)}(T_{LT}-c_{T_{LT}}) + a_{T_S}^{(2)}((T_S-c_{T_S})^2 -$$
$$b_{T_S}^{(2)}) + a_{T_S}^{(1)}(T_S-c_{T_S}) + a_{T_E}^{(1)}(T_E-c_{T_E}) + a_{\psi_{Si}}^{(5)}$$
$$((\psi_{Si}-c_{\psi_{Si}})^5 - b_{\psi_{Si}}^{(5)}) + a_{\psi_{Si}}^{(4)}((\psi_{Si}-c_{\psi_{Si}})^4 - b_{\psi_{Si}}^{(4)}) +$$
$$a_{\psi_{Si}}^{(3)}((\psi_{Si}-c_{\psi_{Si}})^3 - b_{\psi_{Si}}^{(3)}) + a_{\psi_{Si}}^{(2)}((\psi_{Si}-c_{\psi_{Si}})^2 -$$
$$b_{\psi_{Si}}^{(2)}) + a_{\psi_{Si}}^{(1)}(\psi_{Si}-c_{\psi_{Si}}) + a_{\theta_{LT}}^{(2)}((\theta_{LT}-c_{\theta_{LT}})^2 -$$
$$b_{\theta_{LT}}^{(2)}) + a_{\theta_{LT}}^{(1)}(\theta_{LT}-c_{\theta_{LT}}) + d_{T_{LT}T_S}(T_{LT}-c_{T_{LT}})$$
$$(T_S-c_{T_S}) + d_{T_{LT}T_E}(T_{LT}-c_{T_{LT}})(T_E-c_{T_E}) + d_{T_{LT}\psi_{Si}}$$
$$(T_{LT}-c_{T_{LT}})(\psi_{Si}-c_{\psi_{Si}}) + e$$

Formula (5)

In this case as well, at least one of the first, second, and third higher-order mode frequencies $f_{h_s\_t}^{(n)}$ determined by Formula (5) and Formula (2) (s is 1, 2, or 3, and the at least one higher-order mode is the first, second, third higher-order mode when s is 1, 2, or 3) has a value that satisfies Formula (3) or Formula (4) for all acoustic wave filters (m) (n<m≤N) having a pass band that is higher than that of the at least one acoustic wave filter (n).

$$f_{h_s\_t}^{(n)} > f_u^{(m)}$$

Formula (3)

$$f_{h_s\_t}^{(n)} < f_l^{(m)}$$

Formula (4)

The h represents a higher-order mode in Formulas (1) to (4) and Formula (5). Furthermore, in this specification, "wavelength-normalized thickness" refers to a thickness obtained by normalizing a thickness using the wavelength of the IDT electrode. Here, "wavelength" refers to a wavelength λ determined by the electrode finger pitch of the IDT electrode. Therefore, a "wavelength-normalized thickness" is a thickness obtained by normalizing the actual thickness by treating λ as 1 and is a value obtained by dividing the actual thickness by λ. The wavelength λ determined by the electrode finger pitch of the IDT electrode may be determined as the average value of the electrode finger pitch. In this specification, a wavelength-normalized thickness may be simply referred to as a "film thickness".

The inventors of preferred embodiments of the present application discovered that the frequency position of the first higher-order mode is affected by the various parameters described above.

Figure 6:
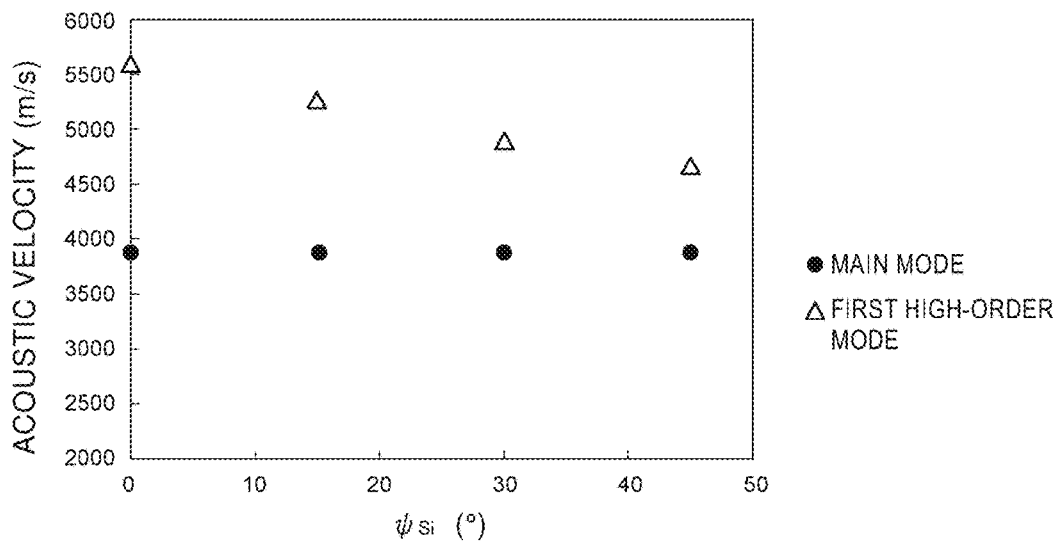
FIG. 6 is a diagram illustrating the relationship between a propagation direction $\psi_{Si}$ of a support substrate made of silicon and the acoustic velocities of a main mode and a first higher-order mode.
Figure 7:
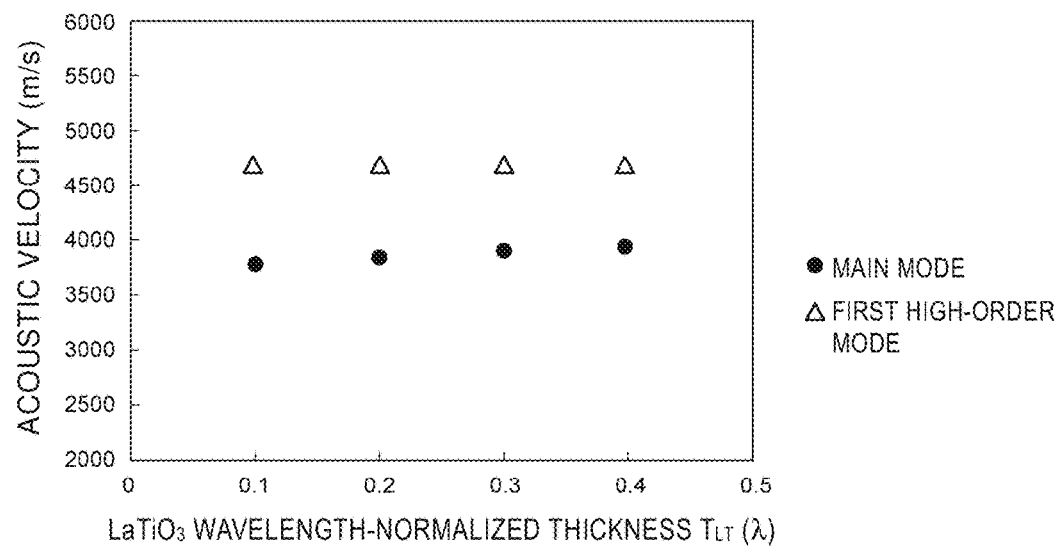
FIG. 7 is a diagram illustrating the relationship between a wavelength-normalized thickness $T_{LT}$ of a piezoelectric body made of lithium tantalate and the acoustic velocities of a main mode and a first higher-order mode.
Figure 8:
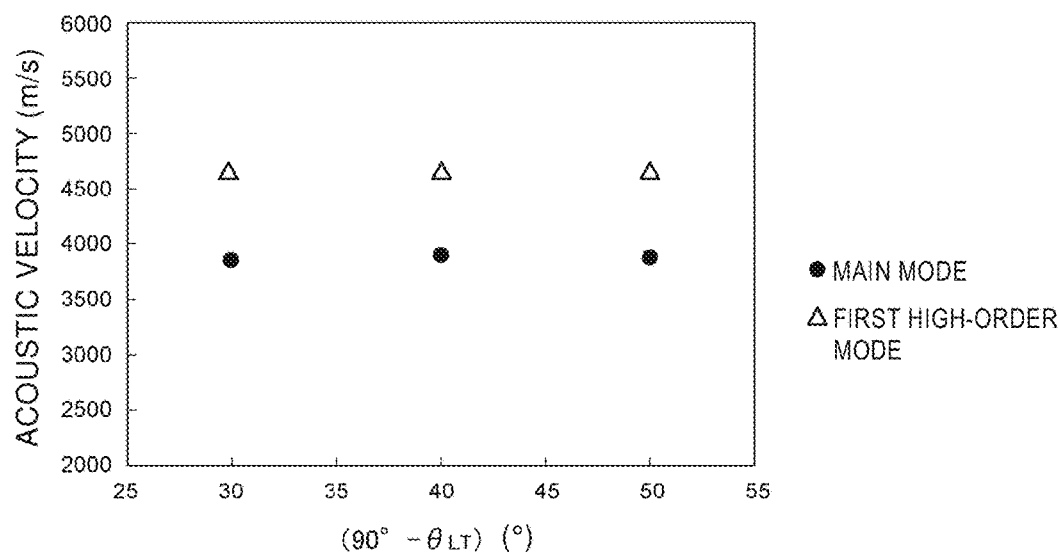
FIG. 8 is a diagram illustrating the relationship between a cut angle ($90°+\theta_{LT}$) of a piezoelectric body made of lithium tantalate and the acoustic velocities of a main mode and a first higher-order mode.
Figure 9:
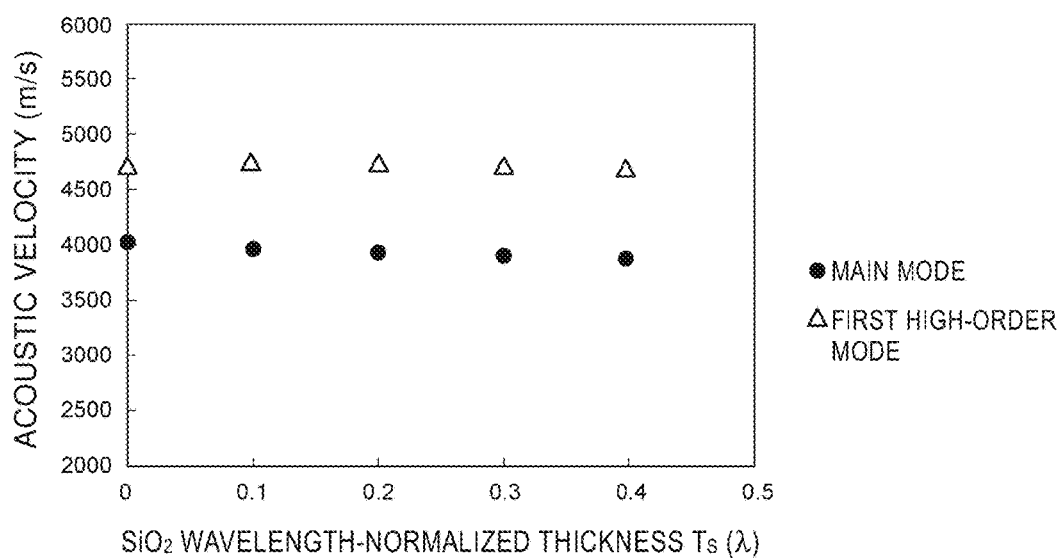
FIG. 9 is a diagram illustrating the relationship between a wavelength-normalized thickness $T_S$ of a silicon oxide film and the acoustic velocities of a main mode and a first higher-order mode.
Figure 10:
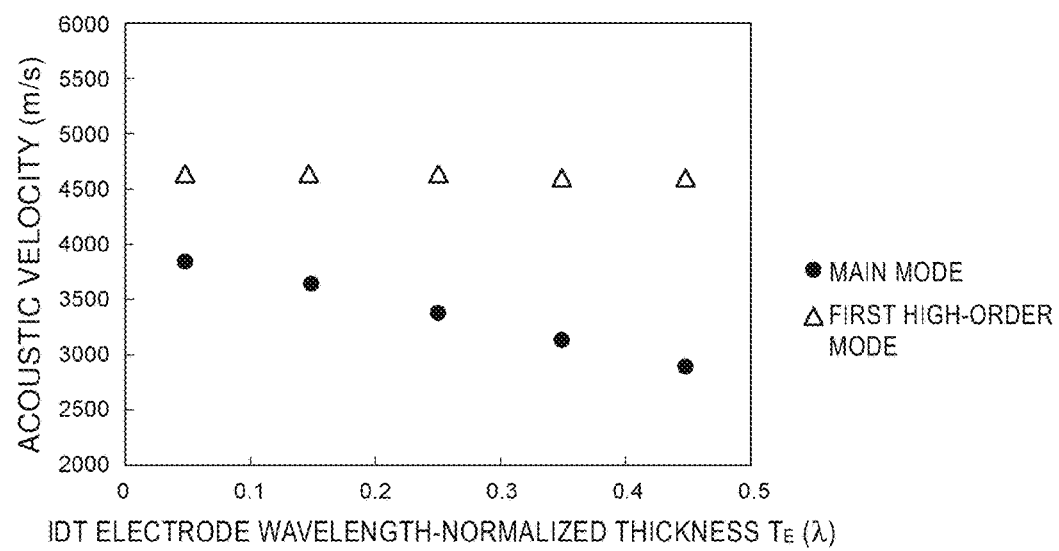
FIG. 10 is a diagram illustrating the relationship between a wavelength-normalized thickness $T_E$ of an IDT electrode and the acoustic velocities of a main mode and a first higher-order mode.

As illustrated in FIG. 6, the acoustic velocity of the main mode negligibly changes whereas the acoustic velocity of the first higher-order mode changes by a large amount when the propagation direction $\psi_{Si}$ of the support substrate made of silicon is changed. As illustrated in FIG. 7, the acoustic velocity of the first higher-order mode changes with the wavelength-normalized thickness $T_{LT}$ of the piezoelectric body made of lithium tantalate. As illustrated in FIG. 8, the acoustic velocity of the first higher-order mode also changes with the cut angle, that is, (90°+$\theta_{LT}$) of the piezoelectric body made of lithium tantalate. As illustrated in FIG. 9, the acoustic velocity of the first higher-order mode also slightly changes with the wavelength-normalized thickness $T_S$ of the silicon oxide film. In addition, as illustrated in FIG. 10, the acoustic velocity of the first higher-order mode also slightly changes with the wavelength-normalized thickness $T_E$ of the IDT electrode. The inventors of preferred embodiments of the present application freely changed these discovered parameters and obtained the corresponding acoustic velocities of the first higher-order mode. As a result, it was discovered that the acoustic velocity of the first higher-order mode is expressed by Formula (1). It was confirmed that the coefficients in Formula (1) preferably have the values listed in Table 7 below for the various crystal orientations of the support substrate made of silicon. In addition, it was confirmed that the coefficients in Formula (5) preferably have the values listed in Table 8 below for the various crystal orientations of the support substrate made of silicon.

TABLE 7

| s = 1, FIRST HIGHER-ORDER MODE | | | |
|---|---|---|---|
| | Si(100) | Si(110) | Si(111) |
| $a_{TLT}^{(3)}$ | 0 | 0 | 0 |
| $a_{TLT}^{(2)}$ | 0 | 0 | 0 |
| $a_{TLT}^{(1)}$ | 425.9853852 | 0 | 0 |
| $b_{TLT}^{(3)}$ | 0 | 0 | 0 |
| $b_{TLT}^{(2)}$ | 0 | 0 | 0 |
| $c_{TLT}$ | −0.250788644 | 0 | 0 |
| $a_{TS}^{(2)}$ | 0 | 0 | 0 |
| $a_{TS}^{(1)}$ | −310.7909155 | −336.9145368 | −208.7868214 |
| $b_{TS}^{(2)}$ | 0 | 0 | 0 |
| $c_{TS}$ | −0.251419558 | −0.250089767 | −0.249747475 |
| $a_{TE}^{(1)}$ | −343.0400174 | 0 | 0 |
| $c_{TE}$ | −0.24873817 | 0 | 0 |
| $a_{\psi Si}^{(5)}$ | 0 | −6.74946E−06 | 0 |
| $a_{\psi Si}^{(4)}$ | 0 | −5.20462E−05 | 0.000690127 |
| $a_{\psi Si}^{(3)}$ | 0.038289166 | 0.019803303 | −0.00044565 |
| $a_{\psi Si}^{(2)}$ | −0.094964284 | 0.235712151 | −0.943979094 |
| $a_{\psi Si}^{(1)}$ | −38.67353446 | −1.11114231 | 0.284195786 |
| $b_{\psi Si}^{(5)}$ | 0 | −235465.9067 | 0 |

TABLE 7-continued s = 1, FIRST HIGHER-ORDER MODE

| | Si(100) | Si(110) | Si(111) |
|---|---|---|---|
| $b_{\psi Si}^{(4)}$ | 0 | −1403030.838 | −343485.2344 |
| $b_{\psi Si}^{(3)}$ | −61.4670366 | −53.06358055 | −25.37154865 |
| $b_{\psi Si}^{(2)}$ | −281.9457851 | −893.934227 | −449.418905 |
| $c_{\psi Si}$ | −22.38170347 | −44.91921005 | −29.88636364 |
| $d_{TLTTS}$ | 3598.117475 | 0 | 0 |
| $d_{TLTTE}$ | 0 | 0 | 0 |
| $d_{TLT\psi Si}$ | 0 | 0 | 0 |
| $d_{TS\psi Si}$ | 0 | 0 | 0 |
| e | 5106.391818 | 5059.084381 | 4779.583333 |

TABLE 8 s = 1, FIRST HIGHER-ORDER MODE

| | Si(100) | Si(110) | Si(111) |
|---|---|---|---|
| $a_{TLT}^{(3)}$ | 0 | 0 | 0 |
| $a_{TLT}^{(2)}$ | 0 | 0 | 0 |
| $a_{TLT}^{(1)}$ | −436.3811104 | 0 | 0 |
| $b_{TLT}^{(3)}$ | 0 | 0 | 0 |
| $b_{TLT}^{(2)}$ | 0 | 0 | 0 |
| $c_{TLT}$ | 0.251271186 | 0 | 0 |
| $a_{TS}^{(2)}$ | 0 | 0 | 0 |
| $a_{TS}^{(1)}$ | −370.8189665 | 0 | −174.7116877 |
| $b_{TS}^{(2)}$ | 0 | 0 | 0 |
| $c_{TS}$ | 0.250529661 | 0 | 0.24371308 |
| $a_{TE}^{(1)}$ | 0 | 0 | 0 |
| $c_{TE}$ | 0 | 0 | 0 |
| $a_{\psi Si}^{(5)}$ | 0 | −6.73542E−06 | 0 |
| $a_{\psi Si}^{(4)}$ | 0 | −4.84328E−05 | 0.000703463 |
| $a_{\psi Si}^{(3)}$ | 0.044803063 | 0.020121569 | −4.77016E−05 |
| $a_{\psi Si}^{(2)}$ | −0.11149637 | 0.237494527 | −0.961938987 |
| $a_{\psi Si}^{(1)}$ | −43.37701861 | −1.22341255 | 0.091605753 |
| $b_{\psi Si}^{(5)}$ | 0 | −78830.27657 | 0 |
| $b_{\psi Si}^{(4)}$ | 0 | 1406271.562 | 340944.6167 |
| $b_{\psi Si}^{(3)}$ | 51.32996847 | −17.77613547 | −41.61537323 |
| $b_{\psi Si}^{(2)}$ | 280.2660593 | 895.2921635 | 446.7591732 |
| $c_{\psi Si}$ | 22.32521186 | 45.02689779 | 30.11392405 |
| $a_{\theta LT}^{(2)}$ | 0 | 0 | 0 |
| $a_{\theta LT}^{(1)}$ | 0 | 0 | 0 |
| $b_{\theta LT}^{(2)}$ | 0 | 0 | 0 |
| $c_{\theta LT}$ | −90 | −90 | −90 |
| $d_{TLTTS}$ | 0 | 0 | 0 |
| $d_{TLTTE}$ | 0 | 0 | 0 |
| $d_{TLT\psi Si}$ | 0 | 0 | 0 |
| e | 5141.869703 | 5073.066348 | 4781.489451 |

When $V_{h1\_t}$ represents the acoustic velocity of the first higher-order mode, the frequency of the first higher-order mode is expressed as $f_{h1\_t}^{(n)}=V_{h1\_t}/\lambda_t^{(n)}$ according to Formula (2). Here, $f_{h1}$ is the frequency of the first higher-order mode, t is the number of an element, such as a resonator forming the n-th filter.

In the present preferred embodiment, as illustrated in Formula (3) and Formula (4), $f_{h1\_t}$ is higher than $f_u^{(m)}$ or lower than $f_l^{(m)}$. In other words, $f_{h1\_t}$ is lower than the low-frequency ends or higher than the high-frequency ends of the second pass band, the third pass band, and the fourth pass band illustrated in FIG. 4. Therefore, it is clear that the frequency $f_{h1\_t}^{(n)}$ of the first higher-order mode is not located inside the second to fourth pass bands.

In Formula (1), (a) In the case where Si(100) (Euler angles ($\varphi_{Si}=0\pm5°$, $\theta_{Si}=0\pm5°$, $\psi_{Si}$)) is used, the range of $\psi_{Si}$ is $0°\leq\psi_{Si}\leq45°$. Here, $\psi_{Si}$ is the angle between the acoustic wave propagation direction and a Miller index, which is crystal orientation [100], of silicon in a plan view seen from the main surface side of the piezoelectric body where the IDT electrode is provided. However, due to the symmetry of the crystal structure of Si(100) $\psi_{Si}$ and $\psi_{Si}\pm(n\times90°)$ have the same meaning (n=1, 2, 3 . . . ). Similarly, $\psi_{Si}$ and $-\psi_{Si}$ have the same meaning. (b) In the case where Si(110) (Euler angles ($\varphi_{Si}=-45\pm5°$, $\theta_{Si}=-90\pm5°$, $\psi_{Si}$)) is used, the range of $\psi_{Si}$ is $0°\leq\psi_{Si}\leq90°$. Here, $\psi_{Si}$ is the angle between the acoustic wave propagation direction and a Miller index, which is crystal orientation [1-10], of silicon in a plan view seen from the main surface side of the piezoelectric body where the IDT electrode is provided. Due to the symmetry of the crystal structure of Si(110), $\psi_{Si}$ and $\psi_{Si}\pm(n\times180°)$ are identical (n=1, 2, 3 . . . ). Similarly, $\psi_{Si}$ and $-\psi_{Si}$ have the same meaning.

(c) In the case where Si(111) (Euler angles ($\varphi_{Si}=-45\pm5°$, $\theta_{Si}=-54.73561\pm5°$, $\psi_{Si}$)) is used, the range of $\psi_{Si}$ is $0°\leq\psi_{Si}\leq60°$. Here, $\psi_{Si}$ is the angle between the acoustic wave propagation direction and a Miller index, which is crystal orientation [1-10], of silicon in a plan view seen from the main surface side of the piezoelectric body where the IDT electrode is provided. However, due to the symmetry of the crystal structure of Si(111), $\psi_{Si}$ and $\psi_{Si}\pm(n\times120°)$ have the same meaning (n=1, 2, 3 . . . ). Similarly, $\psi_{Si}$ and $-\psi_{Si}$ have the same meaning.

In addition, although the range of $\theta_{LT}$ is $-180°<\theta_{LT}\leq0°$, $\theta_{LT}$ and $\theta_{LT}+180°$ may be treated as having the same meaning.

In this specification, in Euler angles (0°±5°, θ, 0°±15°), "0°±5°" means within a range greater than or equal to about −5° and less than or equal to about +5° and "0°±15°" means within a range greater than or equal to about −15° and less than or equal to about +15°.

The wavelength-normalized thickness $T_E$ of the IDT electrode 15 is a thickness converted into a film thickness of an IDT electrode which is preferably made of aluminum, for example. However, the electrode material is not limited to Al. Various metals such as Ti, NiCr, Cu, Pt, Au, Mo, and W can be used. In addition, alloys having these metals as main components may be used. Furthermore, a multilayer metal film obtained by stacking a plurality of metal films made of such metals or alloys may be used.

Figure 11A:
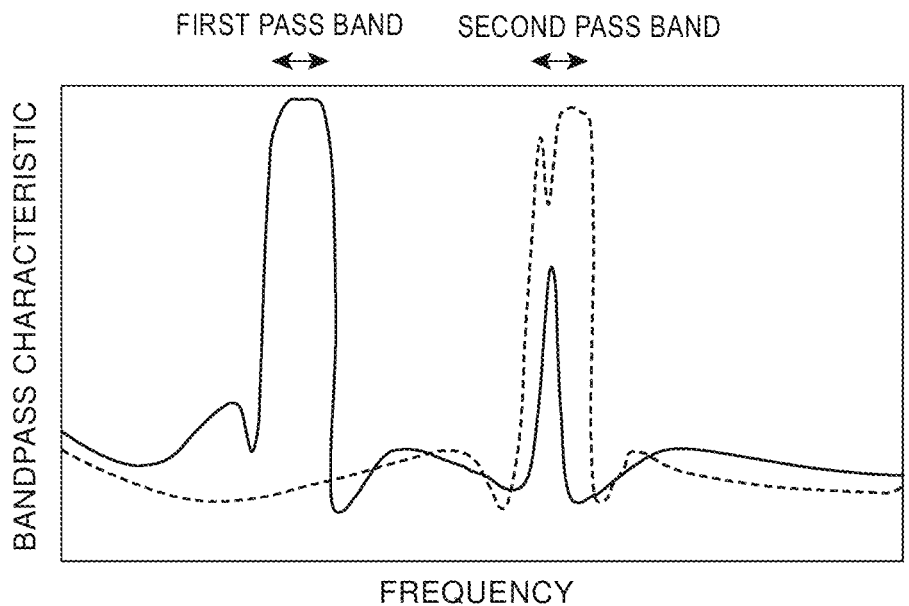
FIG. 11A is a diagram illustrating the filter characteristic of a multiplexer of a comparative example and FIG. 11B is a diagram illustrating the filter characteristic of the multiplexer of the first preferred embodiment of the present invention.
Figure 11B:
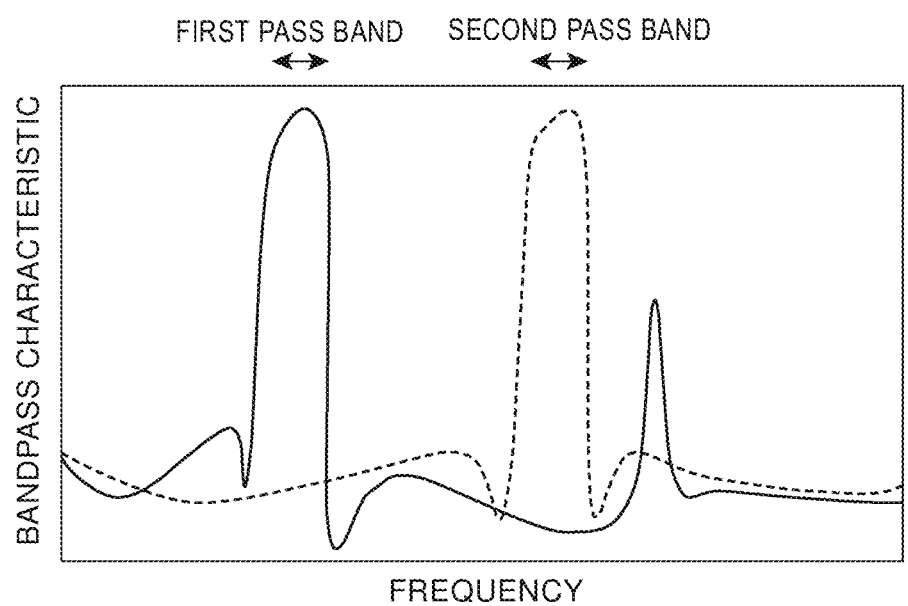

FIG. 11A is a diagram illustrating the filter characteristics of a multiplexer of a comparative example in which the acoustic wave resonator does not satisfy Formula (3) and Formula (4), and FIG. 11B is a diagram illustrating the filter characteristics of the multiplexer of the first preferred embodiment.

In FIGS. 11A and 11B, the filter characteristics of the first acoustic wave filter and the second acoustic wave filter are illustrated. The solid line represents the filter characteristics of the first acoustic wave filter. As illustrated by the broken line in FIG. 11A, a ripple appears in the pass band of the filter characteristics of the second acoustic wave filter. This ripple is caused by a higher-order mode response of an acoustic wave resonator inside the first acoustic wave filter. In contrast, as illustrated in FIG. 11B, in the multiplexer of the first preferred embodiment, this ripple does not appear in the pass band of the second acoustic wave filter. In other words, as a result of the acoustic wave resonator being configured to satisfy Formula (3) or Formula (4), the ripple does not appear in the second pass band of the second acoustic wave filter.

Figure 12:
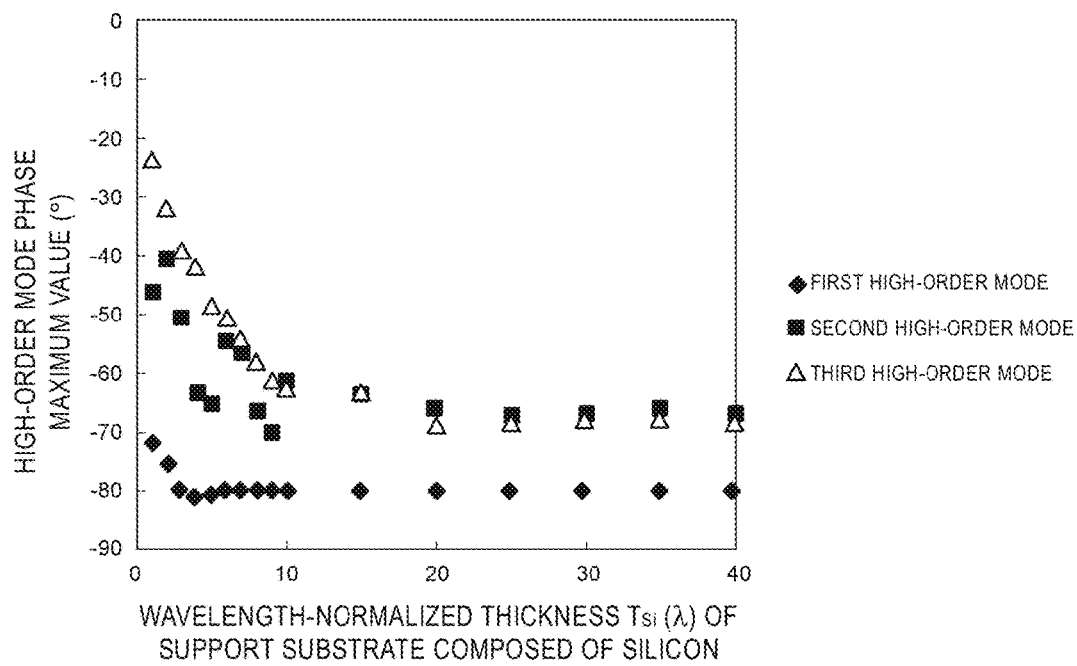
FIG. 12 is a diagram illustrating the relationship between the wavelength-normalized thickness of a support substrate made of silicon and the maximum phase values of a first higher-order mode, a second higher-order mode, and a third higher-order mode.

FIG. 12 is a diagram illustrating the relationship between the wavelength-normalized thickness of a support substrate made of silicon and the maximum phase values of a first higher-order mode, a second higher-order mode, and a third higher-order mode. It is clear from FIG. 12 that the size of the first higher-order mode response is substantially constant and sufficiently small when the wavelength-normalized thickness of the support substrate made of silicon is larger than about 4λ. When the wavelength-normalized thickness of the support substrate is larger than about 10λ, the second and third higher-order mode responses are also small and when the wavelength-normalized thickness of the support substrate is larger than about 20λ the first to third higher-order modes are all sufficiently small. Therefore, the wavelength-normalized thickness $T_{Si}$ of the support substrate is preferably $T_{Si}$>4. The wavelength-normalized thickness $T_{Si}$ of the support substrate is more preferably $T_{Si}$>10. The wavelength-normalized thickness $T_{Si}$ of the support substrate is still more preferably $T_{Si}$>20.

In the present preferred embodiment, the frequency of the first higher-order mode in at least one acoustic wave resonator among the plurality of acoustic wave resonators of the first acoustic wave filter 3 satisfies Formula (3) or Formula (4). More preferably, the frequency of a higher-order mode response in an acoustic wave resonator that is closest to the antenna terminal satisfy Formula (3) or Formula (4). This is because the effect of a higher-order mode of the acoustic wave resonator that is closest to the antenna terminal tends to appear more significantly in the pass bands of the other second to fourth acoustic wave filters 4 to 6 compared with the other acoustic wave resonators.

More preferably, the frequency position of the first higher-order mode satisfy Formula (3) or Formula (4) in all of the acoustic wave resonators. As a result, it is even more unlikely that a ripple caused by a first higher-order mode response will appear in the pass bands of the second to fourth acoustic wave filters 4 to 6.

When the structure according to preferred embodiments of the present invention is used, as described above, there is a tendency for a higher-order mode to be trapped in a portion of the structure where the silicon oxide film 13 and the piezoelectric body 14 are stacked, but by making the portion where the silicon oxide film 13 and the piezoelectric body 14 are stacked thin by making the thickness of the piezoelectric body 14 less than or equal to about 3.5λ, for example, it becomes less likely that a higher-order mode will be trapped.

More preferably, the film thickness of the piezoelectric body 14 made of lithium tantalate is less than or equal to about 2.5λ, for example, and in this case, the absolute value of the temperature coefficient of frequency TCF can be reduced. Still more preferably, the film thickness of the piezoelectric body 14 made of lithium tantalate is less than or equal to about 1.5λ, for example. In this case, the electromechanical coupling coefficient can be easily adjusted. Still more preferably, the film thickness of the piezoelectric body 14 made of lithium tantalate is less than or equal to about 0.5λ, for example. In this case, the electromechanical coupling coefficient can be easily adjusted over a wide range.

Second Preferred Embodiment

In a second preferred embodiment of the present invention, a ripple of a second higher-order mode rather than a first higher-order mode is not located in the pass bands of the second to fourth filters 4 to 6. This will be explained with reference to FIGS. 13 to 17.

Figure 13:
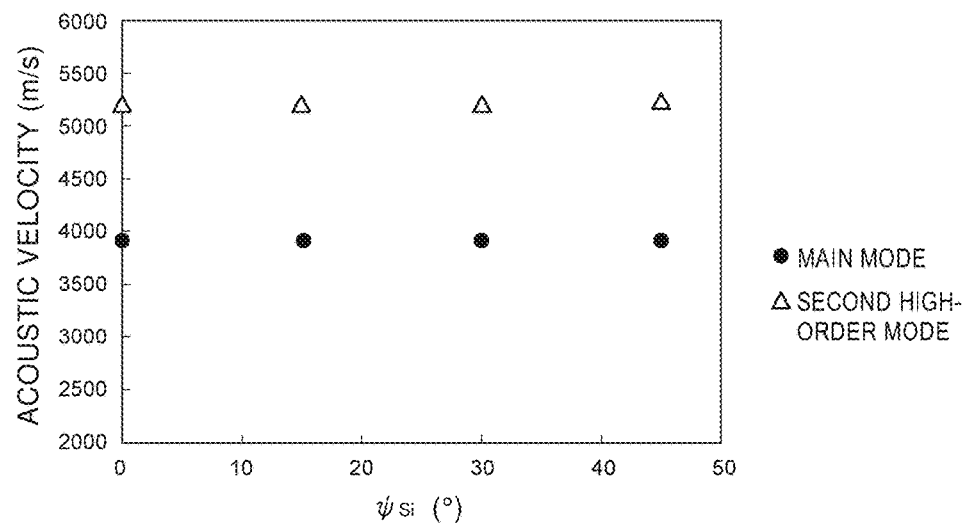
FIG. 13 is a diagram illustrating the relationship between a propagation direction $\psi_{Si}$ of a support substrate made of silicon and the acoustic velocities of a main mode and a second higher-order mode.
Figure 14:
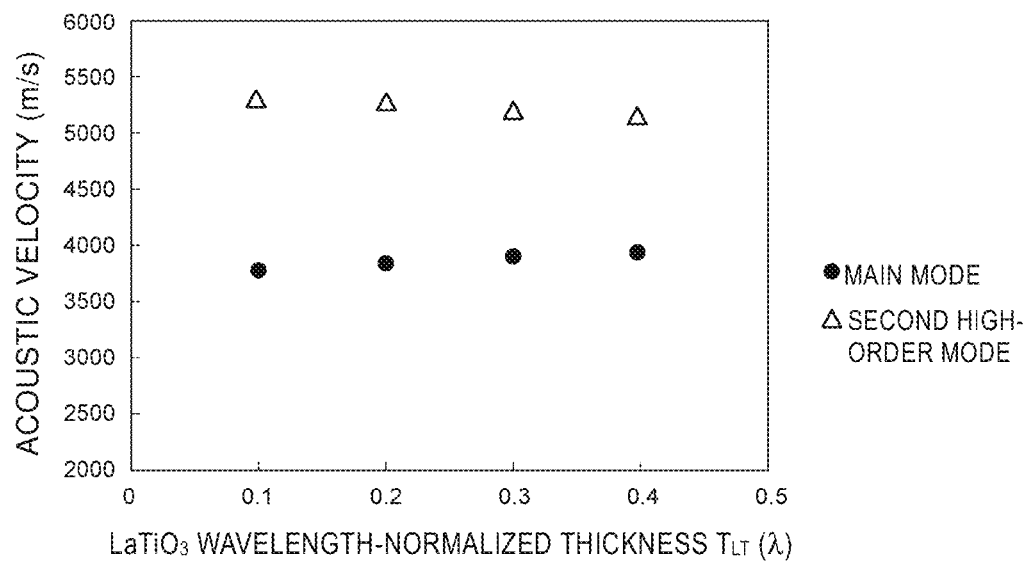
FIG. 14 is a diagram illustrating the relationship between a wavelength-normalized thickness $T_{LT}$ of a piezoelectric body made of lithium tantalate and the acoustic velocities of a main mode and a second higher-order mode.
Figure 15:
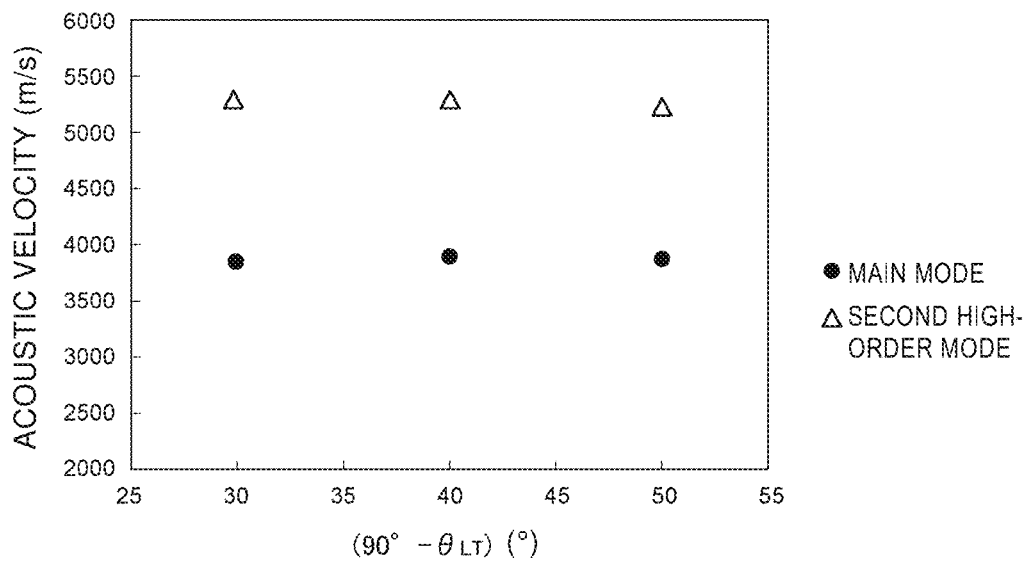
FIG. 15 is a diagram illustrating the relationship between a cut angle ($90°+\theta_{LT}$) of a piezoelectric body made of lithium tantalate and the acoustic velocities of a main mode and a second higher-order mode.
Figure 16:
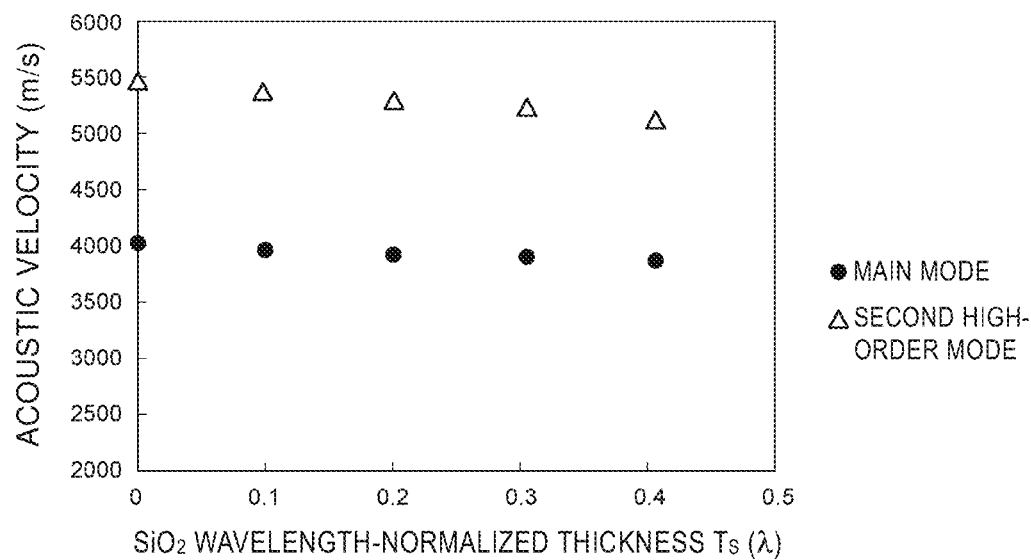
FIG. 16 is a diagram illustrating the relationship between a wavelength-normalized thickness $T_S$ of a silicon oxide film and the acoustic velocities of a main mode and a second higher-order mode.
Figure 17:
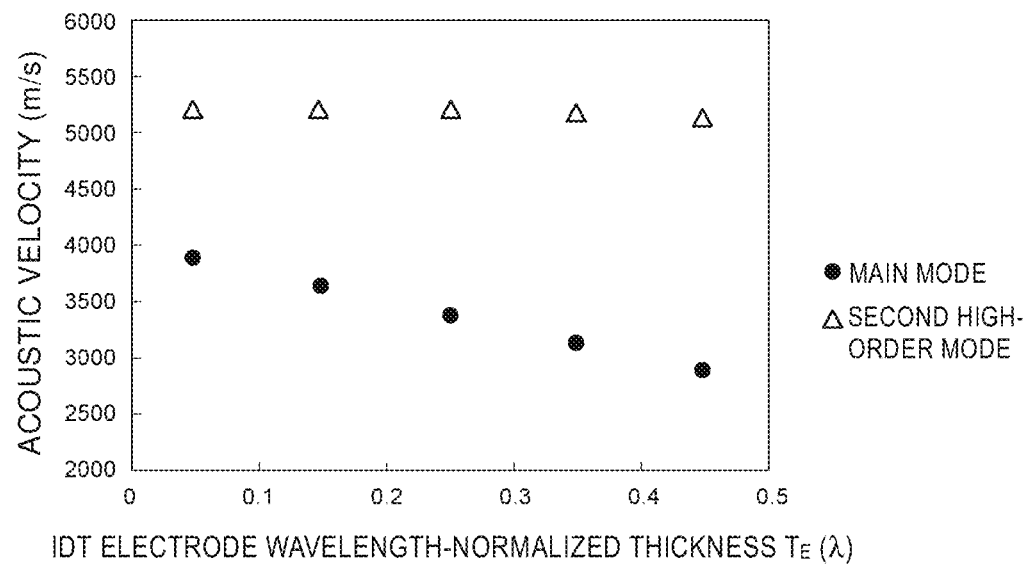
FIG. 17 is a diagram illustrating the relationship between a wavelength-normalized thickness $T_E$ of an IDT electrode and the acoustic velocities of a main mode and a second higher-order mode.

As illustrated in FIG. 13, the acoustic velocity of the second higher-order mode changes with the propagation direction $\psi_{Si}$. Similarly, as illustrated in FIG. 14, the acoustic velocity of the second higher-order mode also changes with the wavelength-normalized thickness $T_{LT}$ of the piezoelectric body made of lithium tantalate. As illustrated in FIG. 15, the acoustic velocity of the second higher-order mode also changes with the cut angle $(90°+\theta_{LT})$ of the piezoelectric body made of lithium tantalate. As illustrated in FIG. 16, the acoustic velocity of the second higher-order mode also changes with the wavelength-normalized thickness $T_S$ of the silicon oxide film. As illustrated in FIG. 17, the acoustic velocity of the second higher-order mode also changes with the wavelength-normalized thickness $T_E$ of the IDT electrode. From the results illustrated in FIGS. 13 to 17, it was discovered that the acoustic velocity of the second higher-order mode is expressed by Formula (1) or Formula (5) similarly to as in the case of the first preferred embodiment. However, it is necessary for the coefficients in Formula (1) to have the values illustrated in below Table 9 for the various crystal orientations of the support substrate made of silicon in the case of the second higher-order mode. In addition, it is necessary for the coefficients in Formula (5) to have the values illustrated in below Table 10 for the various crystal orientations of the support substrate made of silicon in the case of the second higher-order mode.

TABLE 9

| | s = 2, SECOND HIGHER-ORDER MODE | | |
|---|---|---|---|
| | Si(100) | Si(110) | Si(111) |
| $a_{TLT}^{(3)}$ | 0 | 0 | 0 |
| $a_{TLT}^{(2)}$ | −2702.266236 | 0 | −5653.691353 |
| $a_{TLT}^{(1)}$ | −1108.194719 | −1832.484916 | −2085.431191 |
| $b_{TLT}^{(3)}$ | 0 | 0 | 0 |
| $b_{TLT}^{(2)}$ | −0.012562893 | 0 | −0.012525532 |
| $c_{TLT}$ | −0.25 | −0.266459627 | −0.249076517 |
| $a_{TS}^{(2)}$ | 0 | 0 | −5326.265048 |
| $a_{TS}^{(1)}$ | −1098.807554 | −1414.469094 | −1393.920797 |
| $b_{TS}^{(2)}$ | 0 | 0 | −0.012524975 |
| $c_{TS}$ | −0.250314465 | −0.265838509 | −0.248812665 |
| $a_{TE}^{(1)}$ | −425.2493774 | −685.2532789 | −603.1460469 |
| $c_{TE}$ | −0.249056604 | −0.252070393 | −0.24762533 |
| $a_{\psi Si}^{(5)}$ | 0 | 0 | 0 |
| $a_{\psi Si}^{(4)}$ | 0 | −7.98132E−05 | 0 |
| $a_{\psi Si}^{(3)}$ | −0.012639133 | 0.000280497 | 0 |
| $a_{\psi Si}^{(2)}$ | 0.036371829 | 0.263718689 | 0 |
| $a_{\psi Si}^{(1)}$ | 9.405264592 | −1.800655724 | 0 |
| $b_{\psi Si}^{(5)}$ | 0 | 0 | 0 |
| $b_{\psi Si}^{(4)}$ | 0 | −1489444.776 | 0 |
| $b_{\psi Si}^{(3)}$ | 42.45115095 | 393.1833251 | 0 |
| $b_{\psi Si}^{(2)}$ | −281.2411 | −940.0003858 | 0 |
| $c_{\psi Si}$ | −22.59433962 | −45.2484472 | 0 |
| $d_{TLTTS}$ | 1797.090996 | 3053.077023 | 0 |
| $d_{TLTTE}$ | −1817.694482 | −2508.85267 | −2601.663877 |
| $d_{TLT \psi Si}$ | 17.0066332 | 9.642397707 | 0 |
| $d_{TS \psi Si}$ | 0 | 0 | 0 |
| e | 5155.137964 | 5034.276458 | 5161.838907 |

TABLE 10

| | s = 2, SECOND HIGHER-ORDER MODE | | |
|---|---|---|---|
| | Si(100) | Si(110) | Si(111) |
| $a_{TLT}^{(3)}$ | 0 | 0 | 0 |
| $a_{TLT}^{(2)}$ | −3168.980655 | −3017.48047 | −6490.588929 |
| $a_{TLT}^{(1)}$ | −1070.770975 | −1740.800945 | −1736.124534 |
| $b_{TLT}^{(3)}$ | 0 | 0 | 0 |
| $b_{TLT}^{(2)}$ | 0.012520877 | 0.011673567 | 0.012932291 |
| $c_{TLT}$ | 0.25 | 0.26454918 | 0.244042365 |
| $a_{TS}^{(2)}$ | 0 | 0 | −5447.157686 |
| $a_{TS}^{(1)}$ | −1175.713239 | −1443.794269 | −1260.230106 |

TABLE 10-continued s = 2, SECOND HIGHER-ORDER MODE

| | Si(100) | Si(110) | Si(111) |
|---|---|---|---|
| $b_{TS}^{(2)}$ | 0 | 0 | 0.012411464 |
| $c_{TS}$ | 0.250104384 | 0.264754098 | 0.243336275 |
| $a_{TE}^{(1)}$ | −440.9839549 | −631.5739347 | −613.3480905 |
| $c_{TE}$ | 0.249686848 | 0.254030055 | 0.249646955 |
| $a_{\psi\ Si}^{(5)}$ | 0 | 0 | 0 |
| $a_{\psi\ Si}^{(4)}$ | 0 | −8.39122E−05 | 0 |
| $a_{\psi\ Si}^{(3)}$ | −0.01385161 | −0.000219614 | 0 |
| $a_{\psi\ Si}^{(2)}$ | 0.040113138 | 0.288564318 | 0.113517332 |
| $a_{\psi\ Si}^{(1)}$ | 10.06827612 | −1.021332326 | 0.01604077 |
| $b_{\psi\ Si}^{(5)}$ | 0 | 0 | 0 |
| $b_{\psi\ Si}^{(4)}$ | 0 | 1489555.068 | 0 |
| $b_{\psi\ Si}^{(3)}$ | −14.09179662 | −1671.679914 | 0 |
| $b_{\psi\ Si}^{(2)}$ | 281.2490194 | 936.1444126 | 446.7377612 |
| $c_{\psi\ Si}$ | 22.53131524 | 46.09631148 | 29.70873786 |
| $a_{\theta\ LT}^{(2)}$ | 0 | 0 | 0 |
| $a_{\theta\ LT}^{(1)}$ | −2.926997767 | 0 | 0 |
| $b_{\theta\ LT}^{(2)}$ | 0 | 0 | 0 |
| $c_{\theta\ LT}$ | −50.02087683 | −90 | −90 |
| $d_{TLTTS}$ | 0 | 0 | 0 |
| $d_{TLTTE}$ | −2151.133017 | −2785.629029 | −2639.620065 |
| $d_{TLT\ \psi\ Si}$ | 17.13925013 | 0 | 0 |
| e | 5188.573706 | 5052.799929 | 5187.888817 |

As described above, a frequency position $f_{h2\_t}^{(n)} = V_{h2\_t}/\lambda_t^{(n)}$ of the second higher-order mode response is obtained using Formula (2) from the obtained second higher-order mode acoustic velocity $V_{h2\_t}$. In the second preferred embodiment, the frequency position $f_{h2\_t}^{(n)}$ of the second higher-order mode is set so as to satisfy Formula (3A) or (4A) below. Therefore, in the second preferred embodiment, the second higher-order mode response is located outside the second to fourth pass bands of the second to fourth acoustic wave filters 4 to 6. Therefore, a ripple due to the second higher-order mode response is unlikely to be generated in the filter characteristics of the second to fourth acoustic wave filters 4 to 6.

$$f_{h2\_t}^{(n)} > f_u^{(m)} \qquad \text{Formula (3A)}$$

$$f_{h2\_t}^{(n)} < f_l^{(m)} \qquad \text{Formula (4A)}$$

More preferably, the frequency position of the second higher-order mode response satisfy Formula (3A) or Formula (4A) in all of the acoustic wave resonators. As a result, it is even more unlikely that a ripple caused by a second higher-order mode response will appear in the pass bands of the second to fourth acoustic wave filters 4 to 6.

Third Preferred Embodiment

In a third preferred embodiment of the present invention, a ripple of a third higher-order mode rather than a first higher-order mode is not located in the pass bands of the second to fourth filters 4 to 6. This will be explained while referring to FIGS. 18 to 22.

Figure 18:
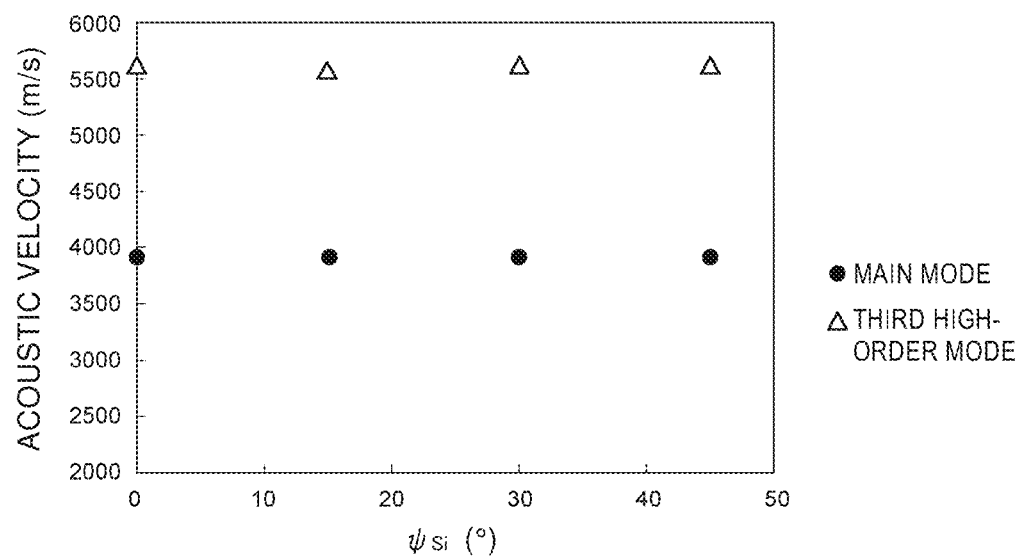
FIG. 18 is a diagram illustrating the relationship between a propagation direction $\psi_{Si}$ of a support substrate made of silicon and the acoustic velocities of a main mode and a third higher-order mode.
Figure 19:
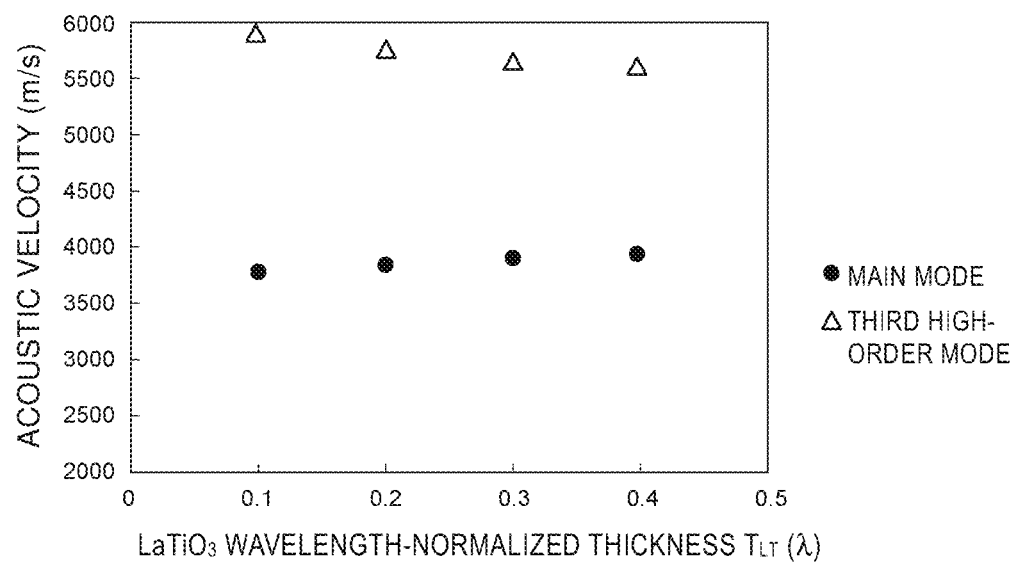
FIG. 19 is a diagram illustrating the relationship between a wavelength-normalized thickness $T_{LT}$ of a piezoelectric body made of lithium tantalate and the acoustic velocities of a main mode and a third higher-order mode.
Figure 20:
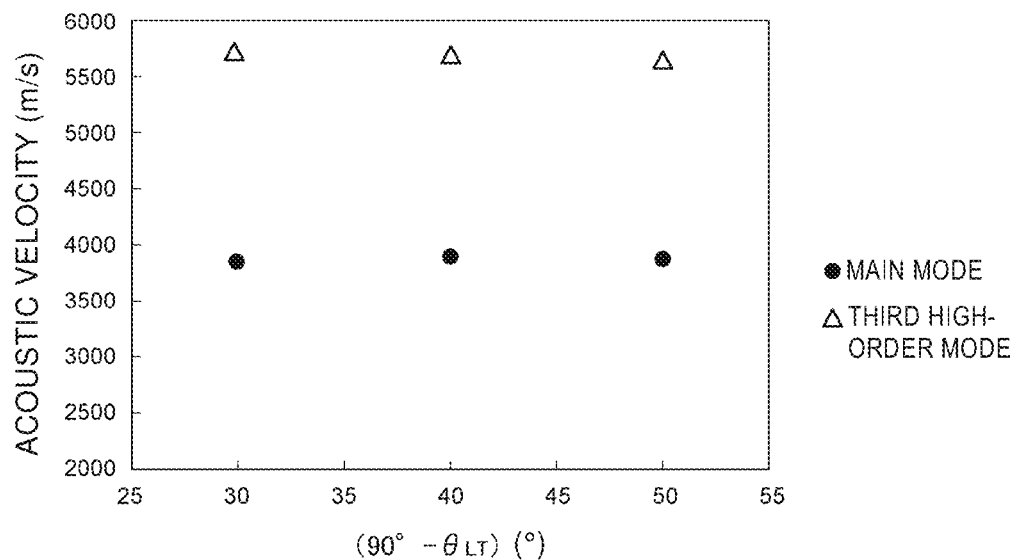
FIG. 20 is a diagram illustrating the relationship between a cut angle ($90°+\theta_{LT}$) of a piezoelectric body made of lithium tantalate and the acoustic velocities of a main mode and a third higher-order mode.
Figure 21:
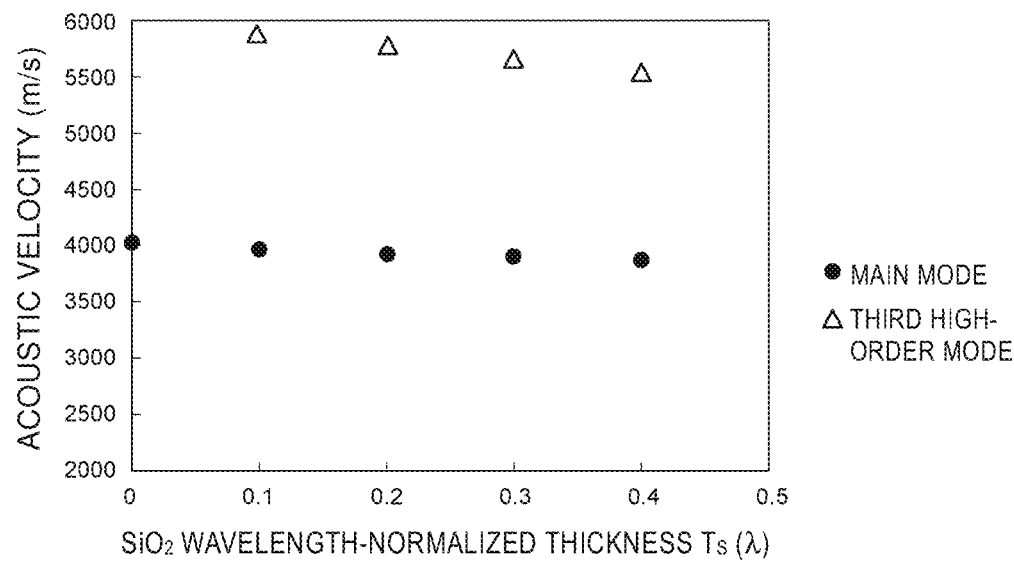
FIG. 21 is a diagram illustrating the relationship between a wavelength-normalized thickness $T_S$ of a silicon oxide film and the acoustic velocities of a main mode and a third higher-order mode.
Figure 22:
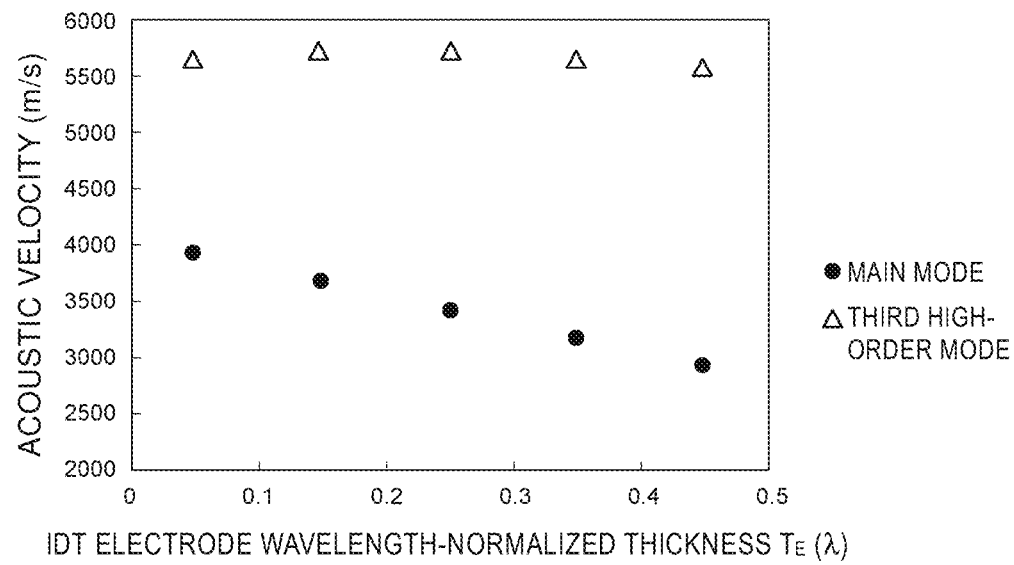
FIG. 22 is a diagram illustrating the relationship between a wavelength-normalized thickness $T_E$ of an IDT electrode and the acoustic velocities of a main mode and a third higher-order mode.

As illustrated in FIG. 18, the acoustic velocity of the third higher-order mode changes with the propagation direction $\psi_{Si}$. Similarly, as illustrated in FIG. 19, the acoustic velocity of the third higher-order mode also changes with the wavelength-normalized thickness $T_{LT}$ of the piezoelectric body made of lithium tantalate. As illustrated in FIG. 20, the acoustic velocity of the third higher-order mode also changes with the cut angle (90°+$\theta_{LT}$) of the piezoelectric body made of lithium tantalate. As illustrated in FIG. 21, the acoustic velocity of the third higher-order mode also changes with the wavelength-normalized thickness $T_S$ of the silicon oxide film. As illustrated in FIG. 22, the acoustic velocity of the third higher-order mode also changes with the wavelength-normalized thickness $T_E$ of the IDT electrode. From the results illustrated in FIGS. 18 to 22, it was found that the acoustic velocity of the third higher-order mode is expressed by Formula (1) or Formula (5) similarly to as in the case of the first preferred embodiment. However, it is necessary for the coefficients in Formula (1) to have the values illustrated in Table 11 below for the various crystal orientations of the support substrate made of silicon in the case of the third higher-order mode. In addition, it is necessary for the coefficients in Formula (5) to have the values illustrated in Table 12 below for the various crystal orientations of the support substrate made of silicon in the case of the third higher-order mode.

TABLE 11 s = 3, THIRD HIGHER-ORDER MODE

| | Si(100) | Si(110) | Si(111) |
|---|---|---|---|
| $a_{TLT}^{(3)}$ | 0 | 0 | −58248.54264 |
| $a_{TLT}^{(2)}$ | 0 | 0 | −10052.90506 |
| $a_{TLT}^{(1)}$ | −881.5328828 | −891.2132267 | −825.4348061 |
| $b_{TLT}^{(3)}$ | 0 | 0 | 0.000343385 |
| $b_{TLT}^{(2)}$ | 0 | 0 | −0.009223119 |
| $c_{TLT}$ | −0.277777778 | −0.276070529 | −0.290410959 |
| $a_{TS}^{(2)}$ | 0 | 0 | −3303.852968 |
| $a_{TS}^{(1)}$ | −722.2669843 | −259.1483206 | −421.8924339 |
| $b_{TS}^{(2)}$ | 0 | 0 | −0.012156596 |
| $c_{TS}$ | −0.274603175 | −0.266498741 | −0.271917808 |
| $a_{TE}^{(1)}$ | −261.1025861 | −448.4580385 | −531.0198608 |
| $c_{TE}$ | −0.261904762 | −0.262342569 | −0.256506849 |
| $a_{\psi\ Si}^{(5)}$ | 0 | −3.61058E−06 | 0 |
| $a_{\psi\ Si}^{(4)}$ | 0 | −0.000249103 | −0.0003974 |
| $a_{\psi\ Si}^{(3)}$ | 0 | 0.006443619 | −0.00154155 |
| $a_{\psi\ Si}^{(2)}$ | 0 | 0.644131383 | 0.487445508 |
| $a_{\psi\ Si}^{(1)}$ | 1.602749894 | 0.627373798 | −0.86354673 |
| $b_{\psi\ Si}^{(5)}$ | 0 | 18501818.64 | 0 |
| $b_{\psi\ Si}^{(4)}$ | 0 | −1623407.504 | −318077.4424 |
| $b_{\psi\ Si}^{(3)}$ | 0 | 6212.965329 | 436.5271955 |
| $b_{\psi\ Si}^{(2)}$ | 0 | −979.8076252 | −423.4213736 |
| $c_{\psi\ Si}$ | −22.08333333 | −47.15365239 | −30.61643836 |
| $d_{TLTTS}$ | −2440.090544 | 0 | 0 |

TABLE 11-continued s = 3, THIRD HIGHER-ORDER MODE

| | Si(100) | Si(110) | Si(111) |
|---|---|---|---|
| $d_{TLTTE}$ | 0 | 0 | −3130.610284 |
| $d_{TLT\,\psi\,Si}$ | 0 | 17.13013839 | 0 |
| $d_{TS\,\psi\,Si}$ | −11.7280604 | 0 | 0 |
| e | 5649.089206 | 5407.876804 | 5432.527804 |

TABLE 12 s = 3, THIRD HIGHER-ORDER MODE

| | Si(100) | Si(110) | Si(111) |
|---|---|---|---|
| $a_{TLT}^{(3)}$ | 24973.69604 | 0 | 0 |
| $a_{TLT}^{(2)}$ | 1430.312613 | 0 | −6156.310187 |
| $a_{TLT}^{(1)}$ | −1027.290569 | −737.4915071 | −1476.525631 |
| $b_{TLT}^{(3)}$ | −0.000364885 | 0 | 0 |
| $b_{TLT}^{(2)}$ | 0.011041041 | 0 | 0.009760415 |
| $c_{TLT}$ | 0.277376171 | 0.283128295 | 0.290986602 |
| $a_{TS}^{(2)}$ | 0 | 0 | 0 |
| $a_{TS}^{(1)}$ | −617.9601012 | 0 | 0 |
| $b_{TS}^{(2)}$ | 0 | 0 | 0 |
| $c_{TS}$ | 0.273226238 | 0 | 0 |
| $a_{TE}^{(1)}$ | −254.6645301 | −400.406917 | −524.8090015 |
| $c_{TE}$ | 0.262449799 | 0.265026362 | 0.25499391 |
| $a_{\psi\,Si}^{(5)}$ | 0 | 0 | 0 |
| $a_{\psi\,Si}^{(4)}$ | 0 | −0.000208283 | −0.000637441 |
| $a_{\psi\,Si}^{(3)}$ | 0 | −0.004709453 | −0.001817349 |
| $a_{\psi\,Si}^{(2)}$ | −0.126294383 | 0.574442977 | 0.749991624 |
| $a_{\psi\,Si}^{(1)}$ | 2.746835794 | 7.891650217 | −0.116425099 |
| $b_{\psi\,Si}^{(5)}$ | 0 | 0 | 0 |
| $b_{\psi\,Si}^{(4)}$ | 0 | 1654327.754 | 303345.3736 |
| $b_{\psi\,Si}^{(3)}$ | 0 | −7229.860818 | −201.8986483 |
| $b_{\psi\,Si}^{(2)}$ | 266.9400494 | 985.3381236 | 411.1815157 |
| $c_{\psi\,Si}$ | 22.10843373 | 47.8602812 | 30.42021924 |
| $a_{\theta\,LT}^{(2)}$ | 0 | 0 | 0.593925697 |
| $a_{\theta\,LT}^{(1)}$ | 0 | 0 | −2.75182308 |
| $b_{\theta\,LT}^{(2)}$ | 0 | 0 | 67.60597649 |
| $c_{\theta\,LT}$ | −90 | −90 | −49.6589525 |
| $d_{TLTTS}$ | −2391.060714 | 0 | 0 |
| $d_{TLTTE}$ | 0 | 0 | −2773.934251 |
| $d_{TLT\,\psi\,Si}$ | −12.5134053 | 15.88855602 | 0 |
| e | 5661.675305 | 5417.174527 | 5440.57579 |

The frequency position of the third higher-order mode response is obtained from the frequency position $f_{h3\_t}^{(n)}= V_{h3\_t}/\lambda_t^{(n)}$ of the third higher-order mode using Formula (2) from the obtained third higher-order mode acoustic velocity $V_{h3\_t}$. In the third preferred embodiment, the frequency position of the third higher-order mode is set so as to satisfy Formula (3B) or (4B) below. Therefore, in the third preferred embodiment, the third higher-order mode response is located outside the second to fourth pass bands of the second to fourth acoustic wave filters 4 to 6. Therefore, a ripple due to the third higher-order mode response is unlikely to occur in the filter characteristics of the second to fourth acoustic wave filters 4 to 6.

$$f_{h3\_t}^{(n)} > f_u^{(m)} \quad \text{Formula (3B)}$$

$$f_{h3\_t}^{(n)} < f_l^{(m)} \quad \text{Formula (4B)}$$

More preferably, the frequency position of the third higher-order mode response satisfy Formula (3B) or Formula (4B) in all of the acoustic wave resonators. As a result, it is even more unlikely that a ripple caused by the third higher-order mode response will appear in the pass bands of the second to fourth acoustic wave filters 4 to 6.

Fourth Preferred Embodiment

A fourth preferred embodiment of the present invention satisfies all of the content of the first preferred embodiment, the second preferred embodiment, and the third preferred embodiment. The specific structure of a multiplexer of the fourth preferred embodiment is the same or substantially the same as that of the first to third preferred embodiments.

In the fourth preferred embodiment, when $V_{h1\_t}$, $V_{h2\_t}$, and $V_{h3\_t}$ respectively represent the acoustic velocities of the first, second, and third higher-order modes, the frequency positions of the responses of the first to third higher-order modes represented by Formula (2) are expressed by $f_{hs\_t}^{(n)}= V_{hs\_t}/\lambda_{t(n)}$. Here, s is 1, 2, or 3. In the fourth preferred embodiment, the frequency $f_{h1\_t}^{(n)}$ of the response of the first higher-order mode, the frequency $f_{h2\_t}^{(n)}$ of the response of the second higher-order mode, and the frequency $f_{h3\_t}^{(n)}$ of the response of the third higher-order mode are all higher than $f_u^{(m)}$ or lower than $f_l^{(m)}$. Therefore, the responses of the first to third higher-order modes are located outside the second to fourth pass bands of the second to fourth acoustic wave filters 4 to 6. Therefore, degradation of the filter characteristics of the second to fourth acoustic wave filters is less likely to occur.

Therefore, summarizing the conditions of the fourth preferred embodiment, $f_{hs\_t}^{(n)}$ (s is 1, 2, or 3) satisfies $f_{hs\_t}^{(n)} > f_u^{(m)}$ or $f_{hs\_t}^{(n)} < f_l^{(m)}$ when s is 1, 2, or 3. In the fourth preferred embodiment as well, preferably, $T_{Si} > 20$, and as a result, the sizes of the responses of the first to third higher-order modes can be reduced.

In the fourth preferred embodiment, the responses of the first higher-order mode, the second higher-order mode, and the third higher-order mode are not located in the pass bands of the second to fourth acoustic wave filters, which are the other acoustic wave filters, but alternatively two higher-order modes among the first to third higher-order modes may be located outside the pass bands of the second to fourth acoustic wave filters such as the first higher-order mode and the second higher-order mode, the first higher-order mode and third higher-order mode, or the second higher-order mode and the third higher-order mode. In other words, the values of $T_{LT}$, $\theta_{LT}$, $T_S$, $T_E$, $\psi_{Si}$, and $T_{Si}$ may be selected so that the frequencies $f_{hs\_t}^{(n)}$ of the first and second higher-order modes satisfy the above Formulas (3) or (4), the values of $T_{LT}$, $\theta_{LT}$, $T_S$, $T_E$, $\psi_{Si}$, and $T_{Si}$ may be selected so that the frequencies $f_{hs\_t}^{(n)}$ of the first and third higher-order modes satisfy the above Formulas (3) or (4), or the values of $T_{LT}$, $\theta_{LT}$, $T_S$, $T_E$, $\psi_{Si}$, and $T_{Si}$ may be selected so that the frequencies $f_{hs\_t}^{(n)}$ of the second and third higher-order modes satisfy the above Formulas (3) or (4). In this case, the effects of the higher-order modes can be further reduced compared with the first to third preferred embodiments.

Figure 23:
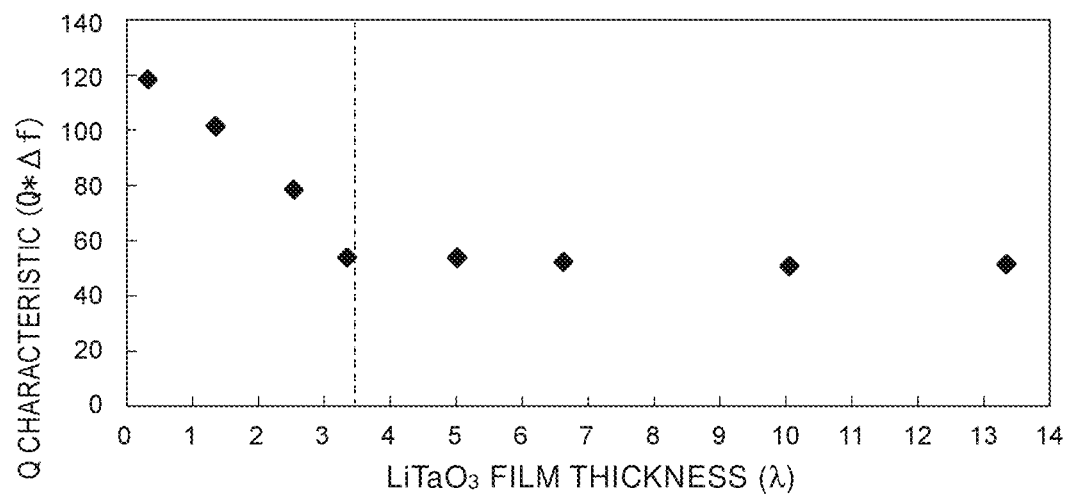
FIG. 23 is a diagram illustrating the relationship between the film thickness of a lithium tantalate film and a Q value in an acoustic wave device.
Figure 24:
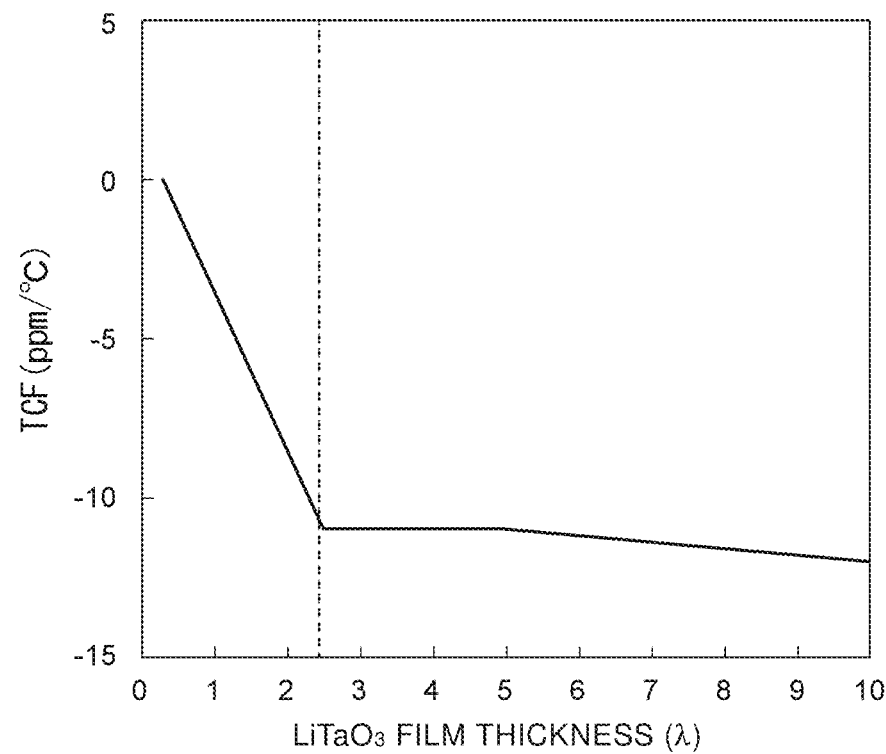
FIG. 24 is a diagram illustrating the relationship between the film thickness of a lithium tantalate film and a temperature coefficient of frequency TCF in an acoustic wave device.
Figure 25:
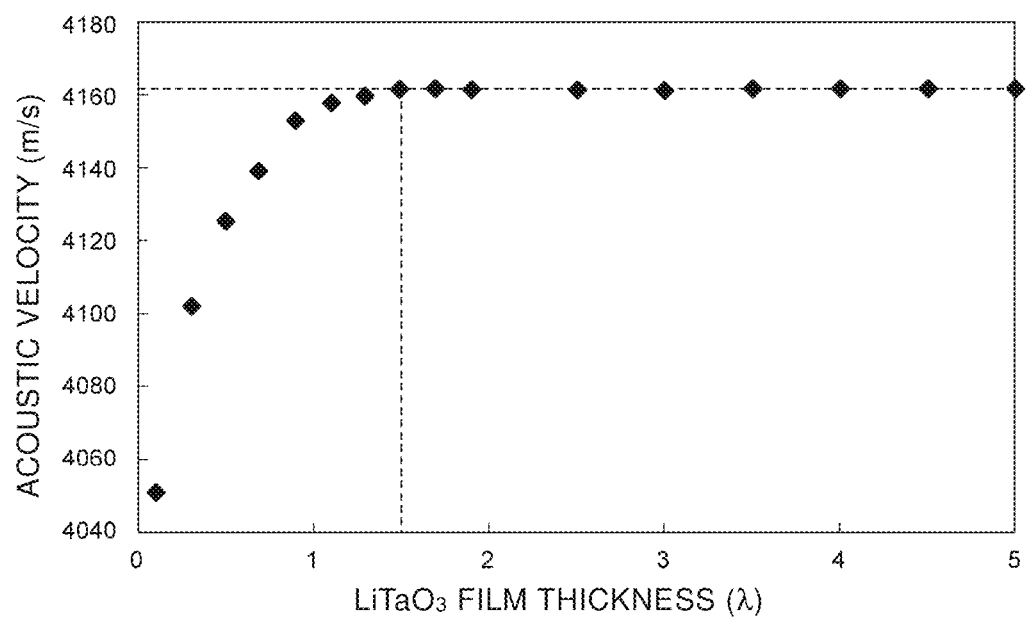
FIG. 25 is a diagram illustrating the relationship between the film thickness of a lithium tantalate film and acoustic velocity in an acoustic wave device.

FIG. 23 is a diagram illustrating the relationship between the film thickness of lithium tantalate and the Q value in an acoustic wave device in which a low-acoustic-velocity film made of a silicon oxide film having a film thickness of about 0.35λ and a piezoelectric film made of lithium tantalate having Euler angles (0°, −40°, 0°) are stacked on a high-acoustic-velocity support substrate made of silicon. The vertical axis in FIG. 23 represents the product of a Q characteristic and a relative bandwidth (Δf) of a resonator. "High-acoustic-velocity support substrate" refers to a support substrate in which the acoustic velocity of a propagating bulk wave is higher than the acoustic velocity of an acoustic wave propagating along the piezoelectric body. "Low-acoustic-velocity film" refers to a film in which the acoustic velocity of a propagating bulk wave is lower than the acoustic velocity of an acoustic wave propagating along the piezoelectric body. In addition, FIG. 24 is a diagram illustrating the relationship between the film thickness of a lithium tantalate film and the temperature coefficient of frequency TCF. FIG. 25 is a diagram illustrating the relationship between the film thickness of a lithium tantalate film and acoustic velocity. From FIG. 23, it is preferable that the film thickness of the lithium tantalate film be less than or equal to about 3.5λ. In this case, the Q value is higher than in the case where the film thickness is greater than about 3.5λ. More preferably, it is desirable that the film thickness of the lithium tantalate film be less than or equal to about 2.5λ in order to further increase the Q value.

Furthermore, from FIG. 24, in the case where the film thickness of the lithium tantalate film is less than or equal to about 2.5λ, the absolute value of the temperature coefficient of frequency TCF can be reduced compared with the case where the film thickness is greater than about 2.5λ. More preferably, the film thickness of the lithium tantalate film is less than or equal to about 2λ, and in this case, the absolute value of the temperature coefficient of frequency TCF can be made to be less than or equal to about 10 ppm/° C. It is further preferable that the film thickness of the lithium tantalate film is less than or equal to about 1.5λ in order to reduce the absolute value of the temperature coefficient of frequency TCF.

From FIG. 25, if the film thickness of the lithium tantalate film is greater than about 1.5λ, the change in acoustic velocity is very small.

Figure 26:
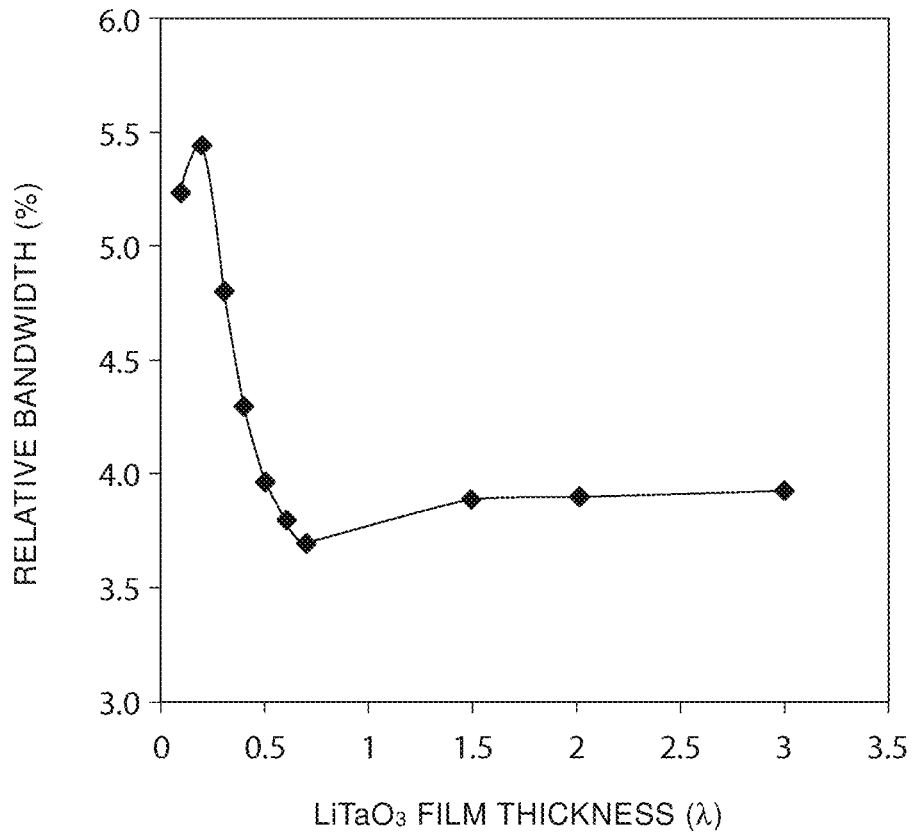
FIG. 26 is a diagram illustrating the relationship between the wavelength-normalized thickness of a piezoelectric film made of lithium tantalate and a relative bandwidth.

However, as illustrated in FIG. 26, the relative bandwidth varies by a large amount in a film thickness range from about 0.05λ to about 0.5λ for the lithium tantalate film. Therefore, the electromechanical coupling coefficient can be adjusted over a wider range. Therefore, it is preferable that the film thickness of the lithium tantalate film lie in a range from about 0.05λ to about 0.5λ, for example, in order to widen the range over which the electromechanical coupling coefficient and the relative bandwidth can be adjusted.

Figure 27:
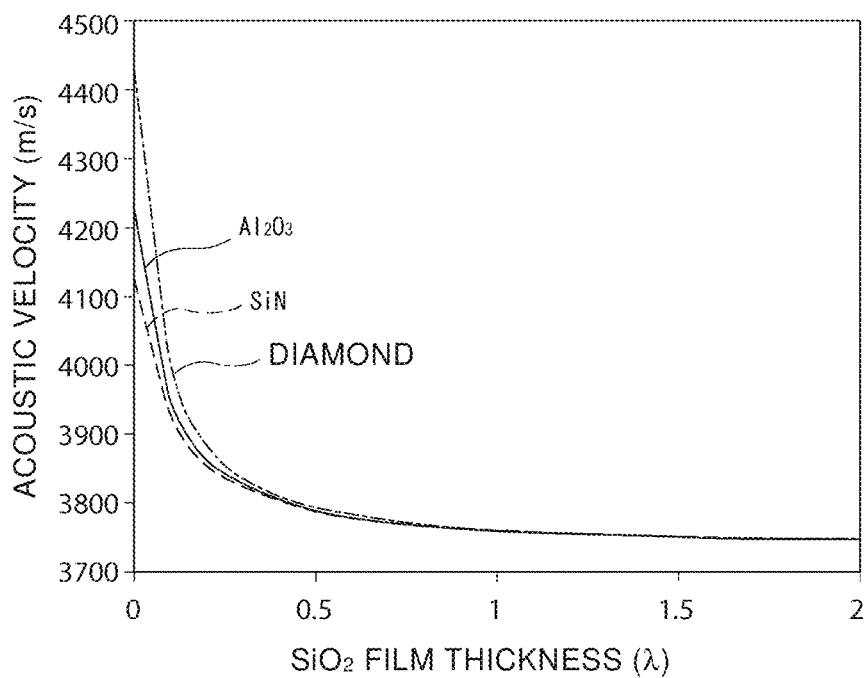
FIG. 27 is a diagram illustrating the relationship between the film thickness of a silicon oxide film, the material of a high-acoustic-velocity film, and acoustic velocity.
Figure 28:
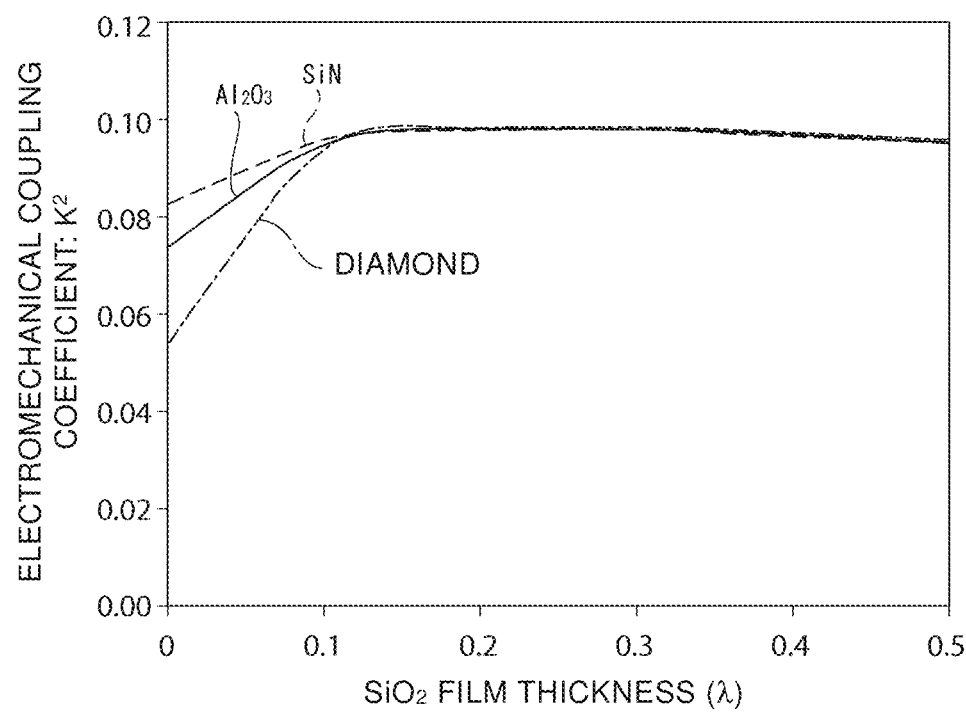
FIG. 28 is a diagram illustrating the relationship between the film thickness of a silicon oxide film, an electromechanical coupling coefficient, and the material of a high-acoustic-velocity film.

FIGS. 27 and 28 are diagrams respectively illustrating the relationships between the film thickness (λ) of the silicon oxide film and the acoustic velocity and the electromechanical coupling coefficient. Here, a silicon nitride film, an aluminum oxide film, and diamond were used as the high-acoustic-velocity film below the low-acoustic-velocity film made of silicon oxide. "High-acoustic-velocity film" refers to a film in which the acoustic velocity of a propagating bulk wave is higher than the acoustic velocity of an acoustic wave propagating along the piezoelectric body. The film thickness of the high-acoustic-velocity film was about 1.5λ. The acoustic velocity of a bulk wave in silicon nitride is about 6000 m/s, the acoustic velocity of a bulk wave in aluminum oxide is about 6000 m/s, and the acoustic velocity of a bulk wave in diamond is about 12800 m/s. As illustrated in FIGS. 27 and 28, the electromechanical coupling coefficient and the acoustic velocity substantially do not change even when the material of the high-acoustic-velocity film and the film thickness of the silicon oxide film are changed. In particular, from FIG. 28, it is clear that the electromechanical coupling coefficient substantially does not change regardless of the material of the high-acoustic-velocity film when the film thickness of the silicon oxide film lies in the range from about 0.1λ to about 0.5λ. Furthermore, it is clear from FIG. 27 that the acoustic velocity does not change regardless of the material of the high-acoustic-velocity film when the film thickness of the silicon oxide film lies in a range from about 0.3λ to about 2λ. Therefore, the film thickness of the low-acoustic-velocity film made of silicon oxide is preferably less than or equal to about 2λ and more preferably less than or equal to about 0.5λ, for example.

Figure 29:
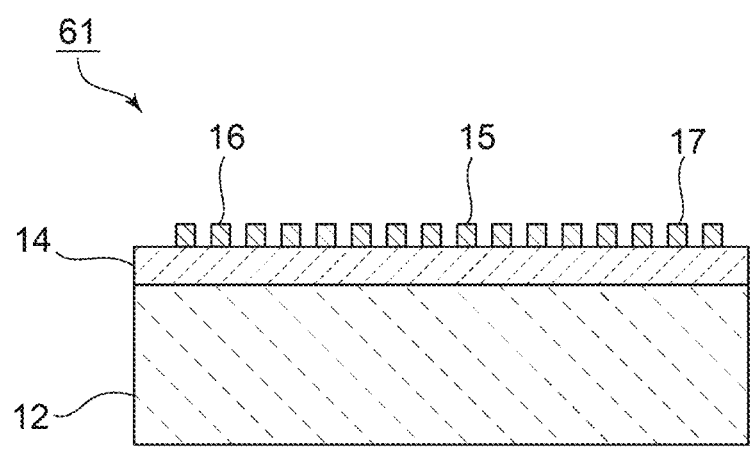
FIG. 29 is a front sectional view of a modification of a preferred embodiment of an acoustic wave resonator used in the present invention.

FIG. 29 is a front sectional view of a modification of an acoustic wave resonator of a preferred embodiment of the present invention. In an acoustic wave resonator 61, the piezoelectric body 14 made of lithium tantalate is preferably stacked on the support substrate 12. The rest of the structure of the acoustic wave resonator 61 is the same or substantially the same as that of the acoustic wave resonator 11.

Figure 30:
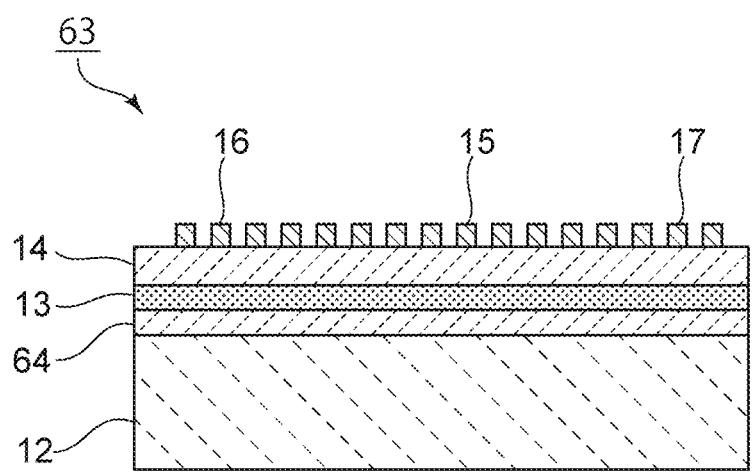
FIG. 30 is a front sectional view of another modification of a preferred embodiment of an acoustic wave resonator used in the present invention.

FIG. 30 is a front sectional view of another modification of an acoustic wave resonator according to a preferred embodiment of the present invention. In an acoustic wave resonator 63, a high-acoustic-velocity film 64 is preferably stacked between the silicon oxide film 13 and the support substrate 12. The high-acoustic-velocity film 64 is preferably made of a high-acoustic-velocity material in which the acoustic velocity of a propagating bulk wave is higher than the acoustic velocity of an acoustic wave propagating along a piezoelectric body 14. The high-acoustic-velocity film 64 is preferably made of silicon nitride, aluminum oxide, DLC, or the like, for example. The rest of the structure of the acoustic wave resonator 63 is the same or substantially the same as that of the acoustic wave resonator 11.

The acoustic wave devices of the above-described preferred embodiments can be used as a duplexer of a radio-frequency front end circuit, for example. An example of such a radio-frequency front end circuit will be described below.

Figure 31:
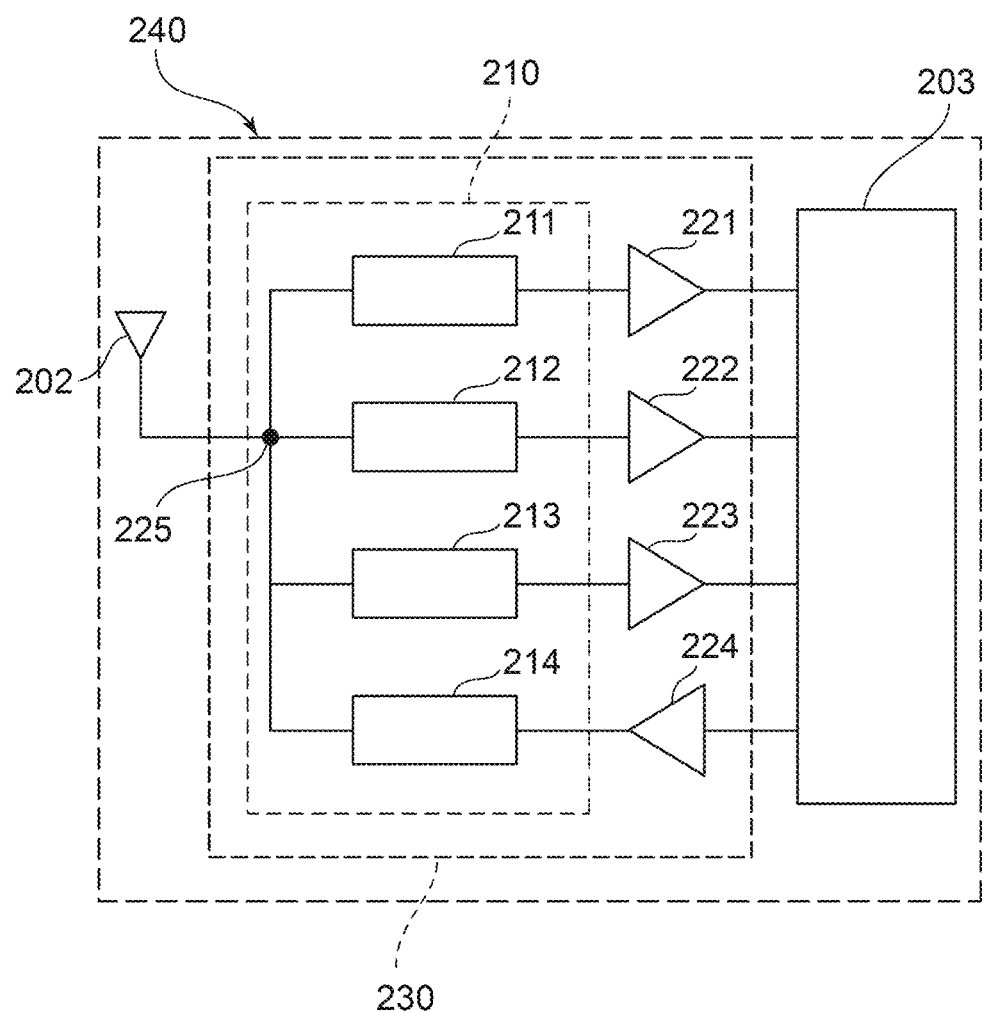
FIG. 31 is a schematic configuration diagram of a communication device including a radio-frequency front end circuit according to a preferred embodiment of the present invention.

FIG. 31 is a schematic configuration diagram of a communication device that includes a radio-frequency front end circuit. A communication device 240 preferably includes an antenna 202, a radio-frequency front end circuit 230, and an RF signal processing circuit 203. The radio-frequency front end circuit 230 is a circuit element that is connected to the antenna 202. The radio-frequency front end circuit 230 includes a multiplexer 210 and amplifiers 221 to 224, which are power amplifiers in the present invention. The multiplexer 210 preferably includes a first filter 211, a second filter 212, a third filter 213, and a fourth filter 214. The multiplexers according to preferred embodiments of the present invention can be used as the multiplexer 210. The multiplexer 210 preferably includes an antenna common terminal 225 that is connected to the antenna 202. First terminals of the first to third filters 211 to 213, which are reception filters, and a first end of the fourth filter 214, which is a transmission filter, are connected to the antenna common terminal 225 to define a common connection. Output terminals of the first to third filters 211 to 213 are respectively connected to the amplifiers 221 to 223. In addition, the amplifier 224 is connected to an input terminal of the fourth filter 214.

The output terminals of the amplifiers 221 to 223 are connected to the RF signal processing circuit 203. The input terminal of the amplifier 224 is connected to the RF signal processing circuit 203.

The multiplexers according to preferred embodiments of the present invention can be suitably used as the multiplexer 210 in the communication device 240.

The multiplexers according to preferred embodiments of the present invention may include only a plurality of transmission filter or may include only a plurality of reception filters. The multiplexers preferably includes n band pass filters, where n is greater than or equal to 2. Therefore, the multiplexers according to preferred embodiments of the present invention may be implemented as a duplexer.

Preferred embodiments of the present invention are widely applicable to communication devices such as mobile phones, for example, in the form of filters, multiplexers applicable to multi-band systems, front end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:

N acoustic wave filters, where N is an integer greater than or equal to 2, including first ends connected to define a common connection and having different pass bands from each other; wherein at least one acoustic wave filter among the N acoustic wave filters except for an acoustic wave filter having the highest pass band includes:

a piezoelectric body made of lithium tantalate having Euler angles ($\varphi_{LT}=0°\pm5°$, $\theta_{LT}$, $\psi_{LT}=0°\pm15°$);

a support substrate made of silicon having Euler angles ($\varphi_{Si}$, $\theta_{Si}$, $\psi_{Si}$);

a silicon oxide film stacked between the piezoelectric body and the support substrate; and a plurality of acoustic wave resonators including interdigital transducer (IDT) electrodes provided on one surface of the piezoelectric body;

where a thickness normalized using a wavelength $\lambda$ determined by an electrode finger pitch of the IDT electrode is referred to as a wavelength-normalized thickness, at least one of first, second, and third higher-order mode frequencies $f_{hs\_t}^{(n)}$, where s is 1, 2, or 3, and the at least one higher-order mode is the first, second, or third higher-order mode when s is 1, 2, or 3) determined by Formula (1) and Formula (2) below using a wavelength-normalized thickness $T_{LT}$ of the piezoelectric body, Euler angles $\theta_{LT}$ of the piezoelectric body, a wavelength-normalized thickness $T_S$ of the silicon oxide film, a wavelength-normalized thickness $T_E$ of the IDT electrode converted into a thickness of aluminum, a propagation direction $\psi_{Si}$ inside the support substrate, and a wavelength-normalized thickness $T_{Si}$ of the support substrate has a value that satisfies Formula (3) or Formula (4) in at least one acoustic wave resonator among the plurality of acoustic wave resonators for all values of m where m>n;

$$V_h = a_{TLT}^{(3)}((T_{LT}+c_{TLT})+b_{TLT}^{(3)})^3 +$$
$$a_{TLT}^{(2)}((T_{LT}+c_{TLT})+b_{TLT}^{(2)})^2 + a_{TLT}^{(1)}(T_{LT}+c_{TLT}) +$$
$$a_{TS}^{(2)}((T_S+c_{TS})+b_{TS}^{(2)})^2 + a_{TS}^{(1)}(T_S+c_{TS}) + a_{IE}^{(1)}(T_E+c_{TE}) +$$
$$a_{\psi Si}^{(5)}((\psi_{Si}+c_{\psi Si})^5 + b_{\psi Si}^{(5)}) + a_{\psi Si}^{(4)}((\psi_{Si}+c_{\psi Si})^4 + b_{\psi Si}^{(4)}) +$$
$$a_{\psi Si}^{(3)}((\psi_{Si}+c_{\psi Si})^3 + b_{\psi Si}^{(3)}) + a_{\psi Si}^{(2)}((\psi_{Si}+c_{\psi Si})^2 + b_{\psi Si}^{(2)}) +$$
$$a_{\psi Si}^{(1)}((\psi_{Si}+c_{\psi Si}) + d_{T_{LT}T_S}(T_{LT}+c_{TLT})(T_S+c_{TS}) +$$
$$d_{T_{LT}T_E}(T_{LT}+c_{TLT})(T_E+c_{TE}) + d_{T_{LT}\psi Si}(T_{LT}+c_{TLT})$$
$$(\psi_{Si}+c_{\psi Si}) + d_{T_S\psi Si}(T_S+c_{TLT})(\psi_{Si}+c_{\psi Si}) + e;$$

Formula (1)

$$f_{hs\_t}^{(n)} = \frac{V_{hs\_t}}{\lambda_t^{(n)}}, (s=1,2,3);$$

Formula (2)

$$f_{hs\_t}^{(n)} > f_u^{(m)};$$

Formula (3)

$$f_{hs\_t}^{(n)} > f_l^{(m)};$$

Formula (4)

where h in Formulas (1) to (4) indicates a higher-order mode, t indicates the t-th element (resonator) in a filter n, m indicates the m-th (m>n) filter, n indicates the n-th filter, $f_u^{(m)}$ is the frequency of the high-frequency end of the pass band of the m-th filter, and $f_l^{(m)}$ is the frequency of the low-frequency end of the pass band of the m-th filter; and the coefficients in Formula (1) respectively have values illustrated in Table 1, Table 2, or Table 3 below for various crystal orientations of the support substrate when s=1, 2, or 3;

TABLE 1 s = 1, FIRST HIGHER-ORDER MODE

| | Si(100) | Si(110) | Si(111) |
|---|---|---|---|
| $a_{TLT}^{(3)}$ | 0 | 0 | 0 |
| $a_{TLT}^{(2)}$ | 0 | 0 | 0 |
| $a_{TLT}^{(1)}$ | 425.9853852 | 0 | 0 |
| $b_{TLT}^{(3)}$ | 0 | 0 | 0 |
| $b_{TLT}^{(2)}$ | 0 | 0 | 0 |
| $c_{TLT}$ | −0.250788644 | 0 | 0 |
| $a_{TS}^{(2)}$ | 0 | 0 | 0 |
| $a_{TS}^{(1)}$ | −310.7909155 | −336.9145368 | −208.7868214 |
| $b_{TS}^{(2)}$ | 0 | 0 | 0 |
| $c_{TS}$ | −0.251419558 | −0.250089767 | −0.249747475 |
| $a_{TE}^{(1)}$ | −343.0400174 | 0 | 0 |
| $c_{TE}$ | −0.24873817 | 0 | 0 |
| $a_{\psi Si}^{(5)}$ | 0 | −6.74946E−06 | 0 |
| $a_{\psi Si}^{(4)}$ | 0 | −5.20462E−05 | 0.000690127 |
| $a_{\psi Si}^{(3)}$ | 0.038289166 | 0.019803303 | −0.00044565 |
| $a_{\psi Si}^{(2)}$ | −0.094964284 | 0.235712151 | −0.943979094 |
| $a_{\psi Si}^{(1)}$ | −38.67353446 | −1.11114231 | 0.284195786 |
| $b_{\psi Si}^{(5)}$ | 0 | −235465.9067 | 0 |
| $b_{\psi Si}^{(4)}$ | 0 | −1403030.838 | −343485.2344 |
| $b_{\psi Si}^{(3)}$ | −61.4670366 | −53.06358055 | −25.37154865 |
| $b_{\psi Si}^{(2)}$ | −281.9457851 | −893.934227 | −449.418905 |
| $c_{\psi Si}$ | −22.38170347 | −44.91921005 | −29.88636364 |
| $d_{TLTTS}$ | 3598.117475 | 0 | 0 |
| $d_{TLTTE}$ | 0 | 0 | 0 |
| $d_{TLT \psi Si}$ | 0 | 0 | 0 |
| $d_{TS \psi Si}$ | 0 | 0 | 0 |
| e | 5106.391818 | 5059.084381 | 4779.583333; |

TABLE 2 s = 2, SECOND HIGHER-ORDER MODE

| | Si(100) | Si(110) | Si(111) |
|---|---|---|---|
| $a_{TLT}^{(3)}$ | 0 | 0 | 0 |
| $a_{TLT}^{(2)}$ | −2702.266236 | 0 | −5653.691353 |
| $a_{TLT}^{(1)}$ | −1108.194719 | −1832.484916 | −2085.431191 |
| $b_{TLT}^{(3)}$ | 0 | 0 | 0 |
| $b_{TLT}^{(2)}$ | −0.012562893 | 0 | −0.012525532 |
| $c_{TLT}$ | −0.25 | −0.266459627 | −0.249076517 |
| $a_{TS}^{(2)}$ | 0 | 0 | −5326.265048 |
| $a_{TS}^{(1)}$ | −1098.807554 | −1414.469094 | −1393.920797 |
| $b_{TS}^{(2)}$ | 0 | 0 | −0.012524975 |
| $c_{TS}$ | −0.250314465 | −0.265838509 | −0.248812665 |
| $a_{TE}^{(1)}$ | −425.2493774 | −685.2532789 | −603.1460469 |
| $c_{TE}$ | −0.249056604 | −0.252070393 | −0.24762533 |
| $a_{\psi Si}^{(5)}$ | 0 | 0 | 0 |
| $a_{\psi Si}^{(4)}$ | 0 | −7.98132E−05 | 0 |

TABLE 2-continued s = 2, SECOND HIGHER-ORDER MODE

| | Si(100) | Si(110) | Si(111) |
|---|---|---|---|
| $a_{\psi\_Si}^{(3)}$ | −0.012639133 | 0.000280497 | 0 |
| $a_{\psi\_Si}^{(2)}$ | 0.036371829 | 0.263718689 | 0 |
| $a_{\psi\_Si}^{(1)}$ | 9.405264592 | −1.800655724 | 0 |
| $b_{\psi\_Si}^{(5)}$ | 0 | 0 | 0 |
| $b_{\psi\_Si}^{(4)}$ | 0 | −1489444.776 | 0 |
| $b_{\psi\_Si}^{(3)}$ | 42.45115095 | 393.1833251 | 0 |
| $b_{\psi\_Si}^{(2)}$ | −281.2411 | −940.0003858 | 0 |
| $c_{\psi\_Si}$ | −22.59433962 | −45.2484472 | 0 |
| $d_{TLTTS}$ | 1797.090996 | 3053.077023 | 0 |
| $d_{TLTTE}$ | −1817.694482 | −2508.85267 | −2601.663877 |
| $d_{TLT\psi\_Si}$ | 17.0066332 | 9.642397707 | 0 |
| $d_{TS\psi\_Si}$ | 0 | 0 | 0 |
| e | 5155.137964 | 5034.276458 | 5161.838907; |

TABLE 3 s = 3, THIRD HIGHER-ORDER MODE

| | Si(100) | Si(110) | Si(111) |
|---|---|---|---|
| $a_{TLT}^{(3)}$ | 0 | 0 | −58248.54264 |
| $a_{TLT}^{(2)}$ | 0 | 0 | −10052.90506 |
| $a_{TLT}^{(1)}$ | −881.5328828 | −891.2122267 | −825.4348061 |
| $b_{TLT}^{(3)}$ | 0 | 0 | 0.000343385 |
| $b_{TLT}^{(2)}$ | 0 | 0 | −0.009223119 |
| $c_{TLT}$ | −0.277777778 | −0.276070529 | −0.290410959 |
| $a_{TS}^{(2)}$ | 0 | 0 | −3303.852968 |
| $a_{TS}^{(1)}$ | −722.2669843 | −259.1483206 | −421.8924339 |
| $b_{TS}^{(2)}$ | 0 | 0 | −0.012156596 |
| $c_{TS}$ | −0.274603175 | −0.266498741 | −0.271917808 |
| $a_{TE}^{(1)}$ | −261.1025861 | −448.4580385 | −531.0198608 |
| $c_{TE}$ | −0.261904762 | −0.262342569 | −0.256506849 |
| $a_{\psi\_Si}^{(5)}$ | 0 | −3.61058E−06 | 0 |
| $a_{\psi\_Si}^{(4)}$ | 0 | −0.000249103 | −0.0003974 |
| $a_{\psi\_Si}^{(3)}$ | 0 | 0.006443619 | −0.00154155 |
| $a_{\psi\_Si}^{(2)}$ | 0 | 0.644131383 | 0.487445508 |
| $a_{\psi\_Si}^{(1)}$ | 1.602749894 | 0.627373798 | −0.86354673 |
| $b_{\psi\_Si}^{(5)}$ | 0 | 18501818.64 | 0 |
| $b_{\psi\_Si}^{(4)}$ | 0 | −1623407.504 | −318077.4424 |
| $b_{\psi\_Si}^{(3)}$ | 0 | 6212.965329 | 436.5271955 |
| $b_{\psi\_Si}^{(2)}$ | 0 | −979.8076252 | −423.4213736 |
| $c_{\psi\_Si}$ | −22.08333333 | −47.15365239 | −30.61643836 |
| $d_{TLTTS}$ | −2440.090544 | 0 | 0 |
| $d_{TLTTE}$ | 0 | 0 | −3130.610284 |
| $d_{TLT\psi\_Si}$ | 0 | 17.13013839 | 0 |
| $d_{TS\psi\_Si}$ | −11.7280604 | 0 | 0 |
| e | 5649.089206 | 5407.876804 | 5432.527804. |

2. The multiplexer according to claim 1, wherein the values of $T_{LT}$, $\theta_{LT}$, $T_S$, $T_E$, $\psi_{Si}$, and $T_{Si}$ are selected so that the first and second higher-order mode frequencies $f_{hs\_t}^{(n)}$ satisfy Formula (3) or Formula (4).

3. The multiplexer according to claim 1, wherein the values of $T_{LT}$, $\theta_{LT}$, $T_S$, $T_E$, $\psi_{Si}$, and $T_{Si}$ are selected so that the first and third higher-order mode frequencies $f_{hs\_t}^{(n)}$ satisfy Formula (3) or Formula (4).

4. The multiplexer according to claim 1, wherein the values of $T_{LT}$, $\theta_{LT}$, $T_S$, $T_E$, $\psi_{Si}$, and $T_{Si}$ are selected so that the second and third higher-order mode frequencies $f_{hs\_t}^{(n)}$ satisfy Formula (3) or Formula (4).

5. The multiplexer according to claim 1, wherein the values of $T_{LT}$, $\theta_{LT}$, $T_S$, $T_E$, $\psi_{Si}$, and $T_{Si}$ are selected so that the first, second, and third higher-order mode frequencies $f_{hs\_t}^{(n)}$ all satisfy Formula (3) or Formula (4).

6. The multiplexer according to claim 1 wherein $T_{Si}>4$ for the wavelength-normalized thickness $T_{Si}$ of the support substrate.

7. The multiplexer according to claim 6, wherein $T_{Si}>10$.

8. The multiplexer according to claim 7, wherein $T_{Si}>20$.

9. The multiplexer according to claim 1, wherein the wavelength-normalized thickness of the piezoelectric body is less than or equal to about 3.5λ.

10. The multiplexer according to claim 9, wherein the wavelength-normalized thickness of the piezoelectric body is less than or equal to about 2.5λ.

11. The multiplexer according to claim 9, wherein the wavelength-normalized thickness of the piezoelectric body is less than or equal to about 1.5λ.

12. The multiplexer according to claim 9, wherein the wavelength-normalized thickness of the piezoelectric body is less than or equal to about 0.5λ.

13. The multiplexer according to claim 1, further comprising:
an antenna terminal to which first ends of a plurality of acoustic wave filters are connected to define a common connection; wherein
the acoustic wave resonator that satisfies Formula (3) or Formula (4) is an acoustic wave resonator that is closest to the antenna terminal.

14. The multiplexer according to claim 1, wherein the plurality of acoustic wave resonators are all acoustic wave resonators that satisfy Formula (3) or Formula (4).

15. The multiplexer according to claim 1, wherein the multiplexer is a duplexer.

16. The multiplexer according to claim 1, wherein the multiplexer is a composite filter in which three or more acoustic wave filters are connected to define a common connection on the antenna terminal side.

17. The multiplexer according to claim 1, wherein the acoustic wave filter including a plurality of acoustic wave resonators is a ladder filter that includes a plurality of series arm resonators and a plurality of parallel arm resonators.

18. A radio-frequency front end circuit comprising:
the multiplexer according to claim 1; and
a power amplifier.

19. A communication device comprising:
a radio-frequency front end circuit including the multiplexer according to claim 1 and a power amplifier; and
an RF signal processing circuit.

20. A multiplexer comprising:
N acoustic wave filters, where N is an integer greater than or equal to 2, including first ends connected to define a common connection and having different pass bands from each other; wherein
where the N acoustic wave filters are a first acoustic wave filter, a second acoustic wave filter, . . . an nth acoustic wave filter in order of increasing pass band;
at least one acoustic wave filter (n) of the N acoustic wave filters except for an acoustic wave filter having a highest pass band among the N acoustic wave filters includes at least one acoustic wave resonator;
the acoustic wave resonator includes:
a piezoelectric body made of lithium tantalate having Euler angles ($\varphi_{LT}=0°\pm5°$, $\theta_{LT}$, $\psi_{LT}=0°\pm15°$);
a support substrate made of silicon having Euler angles ($\varphi_{Si}$, $\theta_{Si}$, $\psi_{Si}$);
a silicon oxide film stacked between the piezoelectric body and the support substrate; and
an interdigital transducer (IDT) electrode provided on one surface of the piezoelectric body;
in the acoustic wave resonator, where a thickness normalized using a wavelength λ determined by an electrode finger pitch of the IDT electrode is referred to as a wavelength-normalized thickness, $T_{LT}$ is a wavelength-normalized thickness of the piezoelectric body, $\theta_{LT}$ is Euler angles of the piezoelectric body, $T_S$ is a wavelength-normalized thickness of the silicon oxide film, $T_E$ is a wavelength-normalized thickness of the IDT electrode converted into a thickness of aluminum, $\psi_{Si}$ is a propagation direction inside the support substrate, and $T_{Si}$ is a wavelength-normalized thickness of the support substrate, at least one out of first, second, and third higher-order mode frequencies $f_{h_s\_t}^{(n)}$, where s is 1, 2, or 3, and the at least one higher-order mode is the first, second, or third higher-order mode when s is 1, 2, or 3, determined by Formula (5) and Formula (2) below determined using $T_{LT}$, $\theta_{LT}$, $T_S$, $T_E$, $\psi_{Si}$, and $T_{Si}$ has a value that satisfies Formula (3) or Formula (4) below in all acoustic wave filters (m) of the N acoustic wave filters having a higher pass band than the at least one acoustic wave filter;

$$V_h = a_{T_{LT}}^{(3)}\left((T_{LT} - c_{T_{LT}}) - b_{T_{LT}}^{(3)}\right)^3 + \quad \text{Formula (5)}$$
$$a_{T_{LT}}^{(2)}\left((T_{LT} - c_{T_{LT}}) - b_{T_{LT}}^{(2)}\right)^2 + a_{T_{LT}}^{(1)}(T_{LT} - c_{T_{LT}}) +$$
$$a_{T_S}^{(2)}\left((T_S - c_{T_S}) - b_{T_S}^{(2)}\right)^2 + a_{T_S}^{(1)}(T_S - c_{T_S}) + a_{T_E}^{(1)}(T_E - c_{T_E}) +$$
$$a_{\psi_{Si}}^{(5)}\left((\psi_{Si} - c_{\psi_{Si}})^5 - b_{\psi_{Si}}^{(5)}\right) + a_{\psi_{Si}}^{(4)}\left((\psi_{Si} - c_{\psi_{Si}})^4 - b_{\psi_{Si}}^{(4)}\right) +$$
$$a_{\psi_{Si}}^{(3)}\left((\psi_{Si} - c_{\psi_{Si}})^3 - b_{\psi_{Si}}^{(3)}\right) + a_{\psi_{Si}}^{(2)}\left((\psi_{Si} - c_{\psi_{Si}})^2 - b_{\psi_{Si}}^{(2)}\right) +$$
$$a_{\psi_{Si}}^{(1)}(\psi_{Si} - c_{\psi_{Si}}) + a_{\theta_{LT}}^{(2)}\left((\theta_{LT} - c_{\theta_{LT}})^2 - b_{\theta_{LT}}^{(2)}\right) +$$
$$a_{\theta_{LT}}^{(1)}(\theta_{LT} - c_{\theta_{LT}}) + d_{T_{LT}T_S}(T_{LT} - c_{T_{LT}})(T_S - c_{T_S}) +$$
$$d_{T_{LT}T_E}(T_{LT} - c_{T_{LT}})(T_E - c_{T_E}) +$$
$$d_{T_{LT}\psi_{Si}}(T_{LT} - c_{T_{LT}})(\psi_{Si} - c_{\psi_{Si}}) + e;$$

$$f_{h_s\_t}^{(n)} = \frac{V_{h_s\_t}}{\lambda_t^{(n)}}, (s = 1, 2, 3); \quad \text{Formula (2)}$$

$$f_{h_s\_t}^{(n)} > f_u^{(m)}; \quad \text{Formula (3)}$$

$$f_{h_s\_t}^{(n)} > f_l^{(m)}; \quad \text{Formula (4)}$$

where h in Formulas (2) to (4) and Formula (5) indicates a higher-order mode, $f_u^{(m)}$ is the frequency of the high-frequency end of the pass band of the acoustic wave filters (m), and $f_l^{(m)}$ is the frequency of the low-frequency end of the pass band of the acoustic wave filters (m); and the coefficients in Formula (2) respectively have values illustrated in Table 4, Table 5, and Table 6 below for various crystal orientations of the support substrate when s=1, 2, or 3;

TABLE 4

| | s = 1, FIRST HIGHER-ORDER MODE | | |
|---|---|---|---|
| | Si(100) | Si(110) | Si(111) |
| $a_{T_{LT}}^{(3)}$ | 0 | 0 | 0 |
| $a_{T_{LT}}^{(2)}$ | 0 | 0 | 0 |
| $a_{T_{LT}}^{(1)}$ | −436.3811104 | 0 | 0 |
| $b_{T_{LT}}^{(3)}$ | 0 | 0 | 0 |
| $b_{T_{LT}}^{(2)}$ | 0 | 0 | 0 |
| $c_{T_{LT}}$ | 0.251271186 | 0 | 0 |
| $a_{T_S}^{(2)}$ | 0 | 0 | 0 |
| $a_{T_S}^{(1)}$ | −370.8189665 | 0 | −174.7116877 |
| $b_{T_S}^{(2)}$ | 0 | 0 | 0 |
| $c_{T_S}$ | 0.250529661 | 0 | 0.24371308 |
| $a_{T_E}^{(1)}$ | 0 | 0 | 0 |
| $c_{T_E}$ | 0 | 0 | 0 |
| $a_{\psi_{Si}}^{(5)}$ | 0 | −6.73542E−06 | 0 |
| $a_{\psi_{Si}}^{(4)}$ | 0 | −4.84328E−05 | 0.000703463 |
| $a_{\psi_{Si}}^{(3)}$ | 0.044803063 | 0.020121569 | −4.77016E−05 |
| $a_{\psi_{Si}}^{(2)}$ | −0.11149637 | 0.237494527 | −0.961938987 |

TABLE 4-continued

| | s = 1, FIRST HIGHER-ORDER MODE | | |
|---|---|---|---|
| | Si(100) | Si(110) | Si(111) |
| $a_{\psi_{Si}}^{(1)}$ | −43.37701861 | −1.22341255 | 0.091605753 |
| $b_{\psi_{Si}}^{(5)}$ | 0 | −78830.27657 | 0 |
| $b_{\psi_{Si}}^{(4)}$ | 0 | 1406271.562 | 340944.6167 |
| $b_{\psi_{Si}}^{(3)}$ | 51.32996847 | −17.77613547 | −41.61537323 |
| $b_{\psi_{Si}}^{(2)}$ | 280.2660593 | 895.2921635 | 446.7591732 |
| $c_{\psi_{Si}}$ | 22.32521186 | 45.02689779 | 30.11392405 |
| $a_{\theta_{LT}}^{(2)}$ | 0 | 0 | 0 |
| $a_{\theta_{LT}}^{(1)}$ | 0 | 0 | 0 |
| $b_{\theta_{LT}}^{(2)}$ | 0 | 0 | 0 |
| $c_{\theta_{LT}}$ | −90 | −90 | −90 |
| $d_{T_{LT}T_S}$ | 0 | 0 | 0 |
| $d_{T_{LT}T_E}$ | 0 | 0 | 0 |
| $d_{T_{LT}\psi_{Si}}$ | 0 | 0 | 0 |
| e | 5141.869703 | 5073.066348 | 4781.489451; |

TABLE 5

| | s = 2, SECOND HIGHER-ORDER MODE | | |
|---|---|---|---|
| | Si(100) | Si(110) | Si(111) |
| $a_{T_{LT}}^{(3)}$ | 0 | 0 | 0 |
| $a_{T_{LT}}^{(2)}$ | −3168.980655 | −3017.48047 | −6490.588929 |
| $a_{T_{LT}}^{(1)}$ | −1070.770975 | −1740.800945 | −1736.124534 |
| $b_{T_{LT}}^{(3)}$ | 0 | 0 | 0 |
| $b_{T_{LT}}^{(2)}$ | 0.012520877 | 0.011673567 | 0.012932291 |
| $c_{T_{LT}}$ | 0.25 | 0.26454918 | 0.244042365 |
| $a_{T_S}^{(2)}$ | 0 | 0 | −5447.157686 |
| $a_{T_S}^{(1)}$ | −1175.713239 | −1443.794269 | −1260.230106 |
| $b_{T_S}^{(2)}$ | 0 | 0 | 0.012411464 |
| $c_{T_S}$ | 0.250104384 | 0.264754098 | 0.243336275 |
| $a_{T_E}^{(1)}$ | −440.9839549 | −631.5739347 | −613.3480905 |
| $c_{T_E}$ | 0.249686848 | 0.254030055 | 0.249646955 |
| $a_{\psi_{Si}}^{(5)}$ | 0 | 0 | 0 |
| $a_{\psi_{Si}}^{(4)}$ | 0 | −8.39122E−05 | 0 |
| $a_{\psi_{Si}}^{(3)}$ | −0.01385161 | −0.000219614 | 0 |
| $a_{\psi_{Si}}^{(2)}$ | 0.040113138 | 0.288564318 | 0.113517332 |
| $a_{\psi_{Si}}^{(1)}$ | 10.06827612 | −1.021332326 | 0.01604077 |
| $b_{\psi_{Si}}^{(5)}$ | 0 | 0 | 0 |
| $b_{\psi_{Si}}^{(4)}$ | 0 | 1489555.068 | 0 |
| $b_{\psi_{Si}}^{(3)}$ | −14.09179662 | −1671.679914 | 0 |
| $b_{\psi_{Si}}^{(2)}$ | 281.2490194 | 936.1444126 | 446.7377612 |
| $c_{\psi_{Si}}$ | 22.53131524 | 46.09631148 | 29.70873786 |
| $a_{\theta_{LT}}^{(2)}$ | 0 | 0 | 0 |
| $a_{\theta_{LT}}^{(1)}$ | −2.926997767 | 0 | 0 |
| $b_{\theta_{LT}}^{(2)}$ | 0 | 0 | 0 |
| $c_{\theta_{LT}}$ | −50.02087683 | −90 | −90 |
| $d_{T_{LT}T_S}$ | 0 | 0 | 0 |
| $d_{T_{LT}T_E}$ | −2151.133017 | −2785.629029 | −2639.620065 |
| $d_{T_{LT}\psi_{Si}}$ | 17.13925013 | 0 | 0 |
| e | 5188.573706 | 5052.799929 | 5187.888817; |

TABLE 6

| | s = 3, THIRD HIGHER-ORDER MODE | | |
|---|---|---|---|
| | Si(100) | Si(110) | Si(111) |
| $a_{T_{LT}}^{(3)}$ | 24973.69604 | 0 | 0 |
| $a_{T_{LT}}^{(2)}$ | 1430.312613 | 0 | −6156.310187 |
| $a_{T_{LT}}^{(1)}$ | −1027.290569 | −737.4915071 | −1476.525631 |
| $b_{T_{LT}}^{(3)}$ | −0.000364885 | 0 | 0 |
| $b_{T_{LT}}^{(2)}$ | 0.011041041 | 0 | 0.009760415 |
| $c_{T_{LT}}$ | 0.277376171 | 0.283128295 | 0.290986602 |
| $a_{T_S}^{(2)}$ | 0 | 0 | 0 |
| $a_{T_S}^{(1)}$ | −617.9601012 | 0 | 0 |
| $b_{T_S}^{(2)}$ | 0 | 0 | 0 |
| $c_{T_S}$ | 0.273226238 | 0 | 0 |
| $a_{T_E}^{(1)}$ | −254.6645301 | −400.406917 | −524.8090015 |
| $c_{T_E}$ | 0.262449799 | 0.265026362 | 0.25499391 |
| $a_{\psi_{Si}}^{(5)}$ | 0 | 0 | 0 |

TABLE 6-continued

| | s = 3, THIRD HIGHER-ORDER MODE | | |
|---|---|---|---|
| | Si(100) | Si(110) | Si(111) |
| $a_{\psi\,Si}^{(4)}$ | 0 | −0.000208283 | −0.000637441 |
| $a_{\psi\,Si}^{(3)}$ | 0 | −0.004709453 | −0.001817349 |
| $a_{\psi\,Si}^{(2)}$ | −0.126294383 | 0.574442977 | 0.749991624 |
| $a_{\psi\,Si}^{(1)}$ | 2.746835794 | 7.891650217 | −0.116425099 |
| $b_{\psi\,Si}^{(5)}$ | 0 | 0 | 0 |
| $b_{\psi\,Si}^{(4)}$ | 0 | 1654327.754 | 303345.3736 |
| $b_{\psi\,Si}^{(3)}$ | 0 | −7229.860818 | −201.8986483 |
| $b_{\psi\,Si}^{(2)}$ | 266.9400494 | 985.3381236 | 411.1815157 |
| $c_{\psi\,Si}$ | 22.10843373 | 47.8602812 | 30.42021924 |
| $a_{\theta\,LT}^{(2)}$ | 0 | 0 | 0.593925697 |
| $a_{\theta\,LT}^{(1)}$ | 0 | 0 | −2.75182308 |
| $b_{\theta\,LT}^{(2)}$ | 0 | 0 | 67.60597649 |
| $c_{\theta\,LT}$ | −90 | −90 | −49.6589525 |
| $d_{TLTTS}$ | −2391.060714 | 0 | 0 |
| $d_{TLTTE}$ | 0 | 0 | −2773.934251 |
| $d_{TLT\,\psi\,Si}$ | −12.5134053 | 15.88855602 | 0 |
| e | 5661.675305 | 5417.174527 | 5440.57579. |

\* \* \* \* \*